(12) United States Patent
Sirringhaus et al.

(10) Patent No.: US 10,018,689 B2
(45) Date of Patent: Jul. 10, 2018

(54) ELECTRONIC DEVICES

(71) Applicants: Henning Sirringhaus, Cambridge (GB); Kazuya Ando, Miyagi (JP); Eiji Saitoh, Miyagi (JP); Sebastian Mooser, Cambridge (GB); Shun Watanabe, Cambridge (GB)

(72) Inventors: Henning Sirringhaus, Cambridge (GB); Kazuya Ando, Miyagi (JP); Eiji Saitoh, Miyagi (JP); Sebastian Mooser, Cambridge (GB); Shun Watanabe, Cambridge (GB)

(73) Assignees: CAMBRIDGE ENTERPRISE LIMITED (GB); TOHOKU UNIVERSITY (JP)

( * ) Notice: Subject to any disclaimer, the term of this patent is extended or adjusted under 35 U.S.C. 154(b) by 362 days.

(21) Appl. No.: 14/436,724

(22) PCT Filed: Oct. 21, 2013

(86) PCT No.: PCT/GB2013/052736
§ 371 (c)(1),
(2) Date: Apr. 17, 2015

(87) PCT Pub. No.: WO2014/060781
PCT Pub. Date: Apr. 24, 2014

(65) Prior Publication Data
US 2016/0169988 A1    Jun. 16, 2016

(30) Foreign Application Priority Data

Oct. 19, 2012 (JP) .................................. 2012-231849
Nov. 27, 2012 (GB) .................................. 1221279.1

(51) Int. Cl.
*G01R 33/07* (2006.01)
*G01R 33/12* (2006.01)
(Continued)

(52) U.S. Cl.
CPC ....... *G01R 33/1284* (2013.01); *G01R 33/075* (2013.01); *H01L 37/00* (2013.01); *H01L 43/065* (2013.01); *H01L 43/10* (2013.01)

(58) Field of Classification Search
CPC . G01R 33/1284; G01R 33/075; H01L 43/065; H01L 37/00; H01L 324/251; H01L 43/10
(Continued)

(56) References Cited

U.S. PATENT DOCUMENTS

2011/0075476 A1* 3/2011 Kajiwara ................ G11C 11/16
                                                               365/170

OTHER PUBLICATIONS

Wohlgenannt M et al: "Spin and magnetic field effects in organic semiconductor devices—Spintronics", IEE Proceedings: Circuits Devices and Systems, Institution of Electrical Engineers, Stenvenage, GB, vol. 152, No. 4, Aug. 5, 2005 (Aug. 5, 2005), pp. 385-392, XP006024925, ISSN: 1350-2409, DOI: 10.1049/1 P-CDS:20045226.*
(Continued)

*Primary Examiner* — Melissa Koval
*Assistant Examiner* — Courtney McDonnough
(74) *Attorney, Agent, or Firm* — Tarolli, Sundheim, Covell & Tummino LLP

(57) ABSTRACT

We describe a method of detecting a voltage from a spin-current, the spin-current comprising a current having a spin predominantly aligned in a spin direction, the method comprising: flowing the spin current through a layer of organic material in a vertical direction through the layer; and detecting an electric field in a lateral direction in the layer of organic material. In a preferred embodiment the organic layer is anisotropic and has a higher electrical conductivity in the lateral direction than in the vertical direction.

8 Claims, 11 Drawing Sheets

(51) Int. Cl.
  *H01L 43/06*  (2006.01)
  *H01L 43/10*  (2006.01)
  *H01L 37/00*  (2006.01)

(58) Field of Classification Search
  USPC .............................................. 324/76.11, 251
  See application file for complete search history.

(56) References Cited

OTHER PUBLICATIONS

Naber et al. "Organic spintronics" J. Phys. D: Appl. Phys. 40, 2007 pp. R205-R228.*

Chang, Jui-Fen, et al. "Hall-effect measurements probing the degree of charge-carrier delocalization in solution-processed crystalline molecular semiconductors." *Physical review letters* 107.6 (2011): 066601.

Chang, Jui-Fen, et al. "Conjugated-Polymer-Based Lateral Heterostructures Defined by High-Resolution Photolithography." *Advanced Functional Materials* 20.17 (2010): 2825-2832.

Saitoh, E., et al. "Conversion of spin current into charge current at room temperature: Inverse spin-Hall effect." *Applied Physics Letters* 88.18 (2006): 182509.

Coey, J. M. D. "Dilute magnetic oxides." *Current Opinion in Solid State and Materials Science* 10.2 (2006): 83-92.

Silsbee, R. H., A. Janossy, and P. Monod. "Coupling between ferromagnetic and conduction-spin-resonance modes at a ferromagnetic—normal-metal interface." *Physical Review B* 19.9 (1979): 4382.

\* cited by examiner

ELECTRONIC DEVICES

RELATED APPLICATIONS

The present invention is a U.S. National Stage under 35 USC 371 patent application, claiming priority to Serial No. PCT/GB2013/052736, filed on 21 Oct. 2013; which claims priority from JP 2012-231849, filed 19 Oct. 2012 and GB 1221279.1, filed 27 Nov. 2012, the entirety of all of which is incorporated herein by reference.

FIELD OF THE INVENTION

This invention relates to methods and devices for spintronics, in particular organic spintronics.

BACKGROUND TO THE INVENTION

In electronic devices based on semiconductors, the charge degree of freedom of carriers (electrons and holes) is utilised to functionalise the electronic properties of these devices. In addition, to the charge degree of freedom, electrons exhibit a spin degree of freedom. Recently, spintronics, which exploits the spin degree of freedom instead of or in addition to the charge degree of freedom of electrons, has attracted much attention as a result of it having potential applications in next generation information technology.

Upon using the charge as well as spin degrees of freedom simultaneously, spintronics aims at producing novel functionalities and properties of devices which cannot be achieved when using conventional electronics. A spin current gives rise to a variety of spintronic functionalities.

Energy dissipation of a spin current is low compared to that of a charge current. Hence, it can be expected that spintronic devices are potentially applicable for efficient energy transport. Thus the generation and detection of a spin current are indispensable when exploiting a spintronic device. Spin pumping has been proposed as a way to generate a spin current (Physical Review B 19, p. 4382, 1979). To detect a spin current, electrical detection using the inverse spin Hall effect (ISHE), which allows for converting a spin current into an electromotive force, has been proposed (Applied Physics Letters 88, p. 182509, 2006).

The Boltzmann equation in steady state is expressed as $$v_k \cdot \nabla f_{k\sigma} + (eE/\hbar) \cdot \nabla_k f_{k\sigma} = (\partial f_{k\sigma}/\partial t)\text{scatt} \quad (1)$$

where the velocity of the electrons $v_k$ is expressed as $$v_k = \hbar k/m,$$

E is the external electric field, $f_{k\sigma}$ is the distribution function of electrons with momentum k, mass m, charge e, and spin σ. On the right-hand side is an electron scattering term, the collision term due to impurity scattering. Here the scattering term on the right side of eq. (1) is given by the flowing eq. (2):

$$\partial f_{k\sigma}/\partial t)_{scatt} = \Sigma_{k'\sigma'}[P_{kk'}{}^{\sigma\sigma'} f_{k'\sigma'} - P_{k'k}{}^{\sigma\sigma'} f_{k\sigma}] \quad (2)$$

where the left term is the scattering term from a state with momentum k' and spin a' to a state with the momentum k and spin a (and vice-versa for the right term), and where $$P_{k'k}{}^{\sigma'\sigma} = (2\pi/\hbar) n_{imp} |<k'\sigma'|\hat{T}|k\sigma>|^2 \delta(\xi_k - \xi_{k'}) \quad (3)$$

is the scattering probability from the state |k σ> to |k'σ'>. $n_{imp}$ is the impurity concentration and $\hat{T}$ is the scattering matrix whose matrix elements are calculated within the second-order Born approximation ($P_{k'k}{}^{\sigma\sigma'}$ can be obtained by changing the position of the prime in eq. (3)). The solution of the Boltzmann equation yields the distribution function $f_{k\sigma}$, $$f_{k\sigma} \approx f_0(\xi_k) - \sigma \frac{\partial f_0(\xi_k)}{\partial \xi_k} \delta\mu(r) + \tau_{tr} \frac{\partial f_0(\xi_k)}{\partial \xi_k} [v_k - \alpha_H \sigma_{\sigma\sigma} \times v_k] \cdot \nabla \mu^\sigma(r) \quad (4)$$

Where σ is the electrical conductivity, $f_0(\xi_k)$ is the Fermi distribution function of an electron with energy $\xi_k$, $\sigma_{\sigma\sigma}$ is the Pauli spin matrix, $\tau_{tr}$ the scattering time due to impurities (the transport relaxation time), μ(r) is the electrochemical potential. Here $\alpha_H$ is the conversion coefficient (the dimensionless parameter of the skew scattering strength):

$$\alpha_H = (2\pi/3)\bar{\eta}_{SO} N(0) V_{imp} \quad (5)$$

where $$\bar{\eta}_{SO} = k_F^2 \eta_{SO}$$

is the dimensionless spin-orbit coupling parameter, N(0) is the density of states of electrons at the Fermi level, and $V_{imp}$ is the strength of the impurity potential. The electrochemical potential, more particularly the non-equilibrium spin accumulation, is expressed as and $$\delta\mu(r) = (\frac{1}{2})(\mu^\uparrow(r) - \mu^\downarrow(r)) \quad (6)$$

$$\mu^\uparrow(r) = \varepsilon_F + e\phi + \delta\mu(r) \text{ and } \mu^\downarrow(r) = \varepsilon_F + e\phi - \delta\mu(r) \quad (6)$$

where the arrows define the electrochemical potential for up spin and down spin channels, respectively and $\varepsilon_F$ and φ are the Fermi energy and electric potential, respectively, and φ=−∇E.

We obtain a transverse charge current generated by a spin current ($j_s^x$ along direction x) generated along the out-of-plane direction, $$j_s^\alpha = -(\sigma_x/e)(\partial \delta\mu(r)/\partial x) \quad (7)$$

through the ISHE as $$\sigma_i = -2e^2 \sum_k \tau_{tr} \frac{\partial f_0(\xi_k)}{\partial \xi_k} (v_k^i)^2 \quad (8)$$

where $\sigma_i$ is the electrical conductivity along the i axis (i=x, y, z).

Charge current density $j_c$ converted from a spin current is expressed in eq. (9) below. The charge current density flowing along the y direction $j_c^y$ rising from the spin current flowing along the x direction is expressed in eq. (10). Thus the charge current density $j_c^y$ generated by the inverse spin Hall effect is expressed as $j_c^y = \alpha_H j_s^x$. That is, using the distribution function $$f_{k\sigma} \text{ and } j_c = e\Sigma_k v_k (f_{k\uparrow} + f_{k\downarrow}), \quad (9)$$

we obtain $$j_c^y = 2e \sum_k \tau_{tr} \frac{\partial f_0(\xi_k)}{\partial \xi_k} (v_k^y)^2 \alpha_H \frac{\partial \delta\mu(r)}{\partial x} \quad (10)$$

Hence, in order to enhance the charge current generated via the ISHE, it is important to use materials which exhibit a large conversion coefficient $\alpha_H$ (see Physical Review B 19, p. 4382, 1979, and Applied Physics Letters 88, p. 182509, 2006).

The ISHE can generally be detected in the following materials: transition metals having either f- or 3d-orbitals, such as Pt, Au, Pd, Ag or Bi as well as alloys composed of these transition metals, or alloys composed of one of these transition metals and either Cu, Al or Si.

Amongst these metals and alloys, Pt- and Bi-doped Cu are very promising as their ISHE efficiencies are very high. When an external magnetic field is applied to such materials, an inverse spin Hall voltage $E_{ISHE}$ is generated in a direction perpendicular to the external magnetic field.

Organic materials are considered promising for spintronics primarily because they can exhibit a long spin coherence time because there is only very weak spin-orbit interaction. However, because a strong spin-orbit interaction is considered important for the process of spin-to-charge conversion, organic materials have, hitherto, not been considered useful for this purpose.

Spintronic technology is promising to deliver a new generation of information processing, information storage and energy conversion devices with reduced power dissipation, higher integration density, high speed and increased energy efficiency. Most spintronic devices rely on sophisticated multilayer architectures with ultrathin, nanometer thick magnetic or non-magnetic films and carefully controlled heterointerfaces. They are typically deposited by sophisticated, vacuum based sputtering or molecular beam epitaxy and patterned by high-resolution lithography, such as deep-UV and electron-beam lithography. These are mostly compatible with existing process technologies for silicon integrated circuits and have a similar cost structure. The integration density is very high and the cost per individual spintronic device is very low, but the technology is expensive for applications that require bulk materials or large substrate areas. Examples of such large-area/bulk spintronic devices include thermoelectric devices that use the spin Seebeck effect to convert a temperature gradient into an electric voltage (see, for example, Bauer, G. et al., Spin caloritronics, Nat. Mat. 11, 3091 (2012).

These typically require bulk quantities of materials and thicker films to allow using a large temperature gradient in order to optimize the thermodynamic conversion efficiency of such a thermoelectric converter. Other examples are low-cost memory devices and intelligent labels that can be integrated into smart packaging for anti-counterfeiting, brand-protection or supply-chain management as well as smart surfaces that have memory elements distributed over relatively large substrate areas.

Conjugated polymers and small organic molecules are enabling new flexible, large-area, low-cost optoelectronic devices, such as organic light-emitting diodes, transistors and solar cells. Due to their exceptionally long spin lifetimes, these carbon-based materials could also have an important impact on spintronics, where carrier spins play a key role in transmitting, processing and storing information. However, to exploit this potential, a method for direct conversion of spin information into an electric signal is needed. The motion of electrons is coupled to their spins through the spin-orbit interaction, a fundamental relativistic effect which is essential for transforming spin information into an electric signal. The spin-orbit interaction causes a flow of spins, a spin current, to induce an electric field perpendicular both to the spin polarization and the direction of the spin current (see, for example, Maekawa, S., Valenzuela, S., Saitoh, E. & Kimura, T. (eds.) Spin Current (Oxford University Press, Oxford, 2012). This is called the Inverse Spin Hall Effect (ISHE). The ISHE has been important for exploring spin physics in metals and semiconductors, because it enables simple and versatile detection of spin currents in non-magnetic materials. The spin-orbit interaction is also an important mechanism for spin relaxation in solids; nonequilibrium spin polarization relaxes due to the coupling between spins and their motion. The spin lifetime in inorganic metals and semiconductors with strong spin-orbit coupling is typically short, typically less than 1 ns. In contrast, the spin lifetime in organic materials composed of light elements can be exceptionally long in excess of 10 µs. This is because the strength of the spin-orbit interaction scales with the fourth power of the atomic number and is relatively weak. Spin relaxation is also influenced by relatively weak hyperfine interactions. It is well established from such considerations that the spin relaxation times in organic materials can be very long, but it is widely believed that the weak spin-orbit interaction in these materials also implies that efficient spin-charge conversion and the inverse spin-Hall effect cannot be observed in organic materials.

We will describe organic electronic devices for spin-charge conversion which operate contrary to the prevailing belief/prejudice.

As outlined above, materials which exhibit a large conversion coefficient $\alpha_H$ should be used in order to enhance the charge current using the ISHE. However, $\alpha_H$ for conventional materials is of the order of 10% at its maximum, as demonstrated for Pt. Theories predict that $\alpha_H$ for Bi-doped Cu could be of the order of 25%. Nonetheless, the conversion coefficient $\alpha_H$ has its limitation.

This invention aims at enhancing the spin current to charge current conversion.

SUMMARY OF THE INVENTION

According to the present invention there is therefore provided a method of detecting an electrical signal from a spin-current, wherein said spin-current comprises a current having a spin predominantly aligned in a spin direction, the method comprising: flowing said spin current through a layer of organic material in a vertical direction through said layer; and detecting a charge current or an electric field in a lateral direction in said layer of organic material.

In this specification where we refer to organic material this may be organo-metallic material, or organic material without a metallic component, or combination of the two. Embodiments of the methods/devices we describe, surprisingly, are effective in converting a spin current to an electromotive force (EMF or voltage). Without wishing to be bound by theory—precise details of the physical mechanism are not yet fully explained—it is believed that the effect of a high spin current to charge current conversion can be explained in terms of the large conductivity anisotropy in the organic material, where a spin current which is injected in the low conductivity direction is converted into a charge current in the high conductivity direction, resulting in a large flux of charges in the high conductivity direction in the organic material. Embodiments of the methods/devices we describe also provide a long spin diffusion time, which is helpful for large voltage generation.

Thus in some preferred embodiments the layer of organic (or organo-metallic) material has a higher electrical conductivity in a lateral direction within the layer than in a vertical direction through a thickness of the layer. In preferred embodiments the organic (or organo-metallic) material comprises an organic semiconductor or conductor such as an undoped or doped conjugated polymer, in particular deposited by solution deposition technique such as spin coating—such organic conductors tend "naturally" to have the desired electrical conductivity anisotropy. Thus the electrical conductivity (at room temperature) of the organic material in the lateral direction may be at least $10^1$, $10^{-2}$, $10^{-1}$, 1, 10, or $10^2$ S/cm. In embodiments the anisotropy (lateral or in-plane conductivity to vertical or out-of-plane conductivity) is at least 10, 100, 1000 or 10000 (in order of increasing preference).

Furthermore, it is deemed beneficial, if the mechanism for spin injection into the organic materials is selected such that the long spin lifetime in the mainly carbon-based organic materials induces a large spin accumulation in the organic material. A large spin accumulation enhances the voltage in the lateral direction generated via the ISHE.

Embodiments of the method comprise aligning the spin direction such that the spin has at least a non-zero component in the lateral direction in the layer of organic material. This is because the generated electric field is proportional to the cross product of the spin current and spin polarization vector.

The spin current may be generated in many different ways: most spintronic devices need at one point to convert the spin information back into charge information in order to allow easy electrical readout. In some particular embodiments, however, a spin current may be generated by flowing an electrical current through a magnetic material adjacent the organic material (a non-local approach to spin current generation as illustrated, for example, in FIG. 9 described later). Additionally or alternatively a spin current may be generated by exciting magnetic resonance, for example ferromagnetic resonance, in a magnetic material adjacent the organic material using an oscillatory drive signal, for example microwave radiation. Although in preferred embodiments the organic material is adjacent the magnetic material, the magnetic material need not be in direct contact with the organic material. Where an external magnetic field is applied the spin polarisation vector is parallel to the magnetization.

Many other techniques may be employed to generate a spin current including, but not limited to: optical techniques, quantum interference, quantum pumping, heat flow and the like.

One aspect of the invention provides a method of generating a spin-current from a charge current wherein said spin-current comprises a current having a spin predominantly aligned in a spin direction, the method comprising: flowing said charge current through a layer of organic material in a vertical direction through said layer; and detecting the spin current in a lateral direction in said layer of organic material.

In some preferred embodiments of the techniques we describe the layer of organic material has a lamellar structure comprising conjugated polymer backbones lying generally within layers within the structure, preferentially aligned in the lateral direction. The conductivity anisotropy may be enhanced by using a conducting/semiconducting polymer with side chains of lesser electrical conductivity of the backbone, as these tend to align preferentially in the vertical direction. Additionally or alternatively the conductivity anisotropy may be increased in other ways, for example by employing a lamellar structure in which one or more 'insulating' layers (layers of reduced electrical conductivity) are interleaved between one or more conducting polymer layers, an example being PEDOT:PSS. Additionally or alternatively one or more layers of inorganic material may be provided adjacent to or interleaved with the one or more layers of organic material, in particular to provide semiconductor, oxide or dielectric layers.

A still further technique for providing, or increasing, the conductivity anisotropy is by doping a layer of conducting or semiconducting organic material. Thus in embodiments the organic material comprises a doped organic semiconductor or conductor or semiconducting or conductive polymer. The dopant may be inorganic, or organic (molecular).

Whilst it is believed that anisotropic electrical conductivity is important for efficient operation of the spin current to charge current conversion this is not necessarily essential. For example the use of an organic material comprising sulphur atoms or even heavier atoms such as tellurium or other heavy metal atoms may enhance spin-orbit coupling, thus leading to effective operation, potentially without anisotropic conductivity. Thus additionally or alternatively to the aforementioned anisotropic conductivity the device, more particularly the organic layer, may include a material to enhance spin-orbit coupling within this layer and/or layer may incorporate one or more heavier elements than carbon, oxygen or sulphur. For similar reasons the device, more particularly the organic layer may additionally or alternatively incorporate inorganic components, for example inorganic nanoparticles. In this case the inorganic components/nanoparticles preferably include an element heavier than sulphur.

It is to be noted that because on one hand increasing spin-orbit coupling may result in an enhancement of the spin Hall angle as defined below, but on the other hand a stronger spin-orbit interaction may decrease the spin lifetime and result in a reduction of spin accumulation in the organic material at the interface, a careful optimization of molecular structure and elemental composition may be required to optimize the strength of the spin-charge conversion in the organic material.

In some preferred embodiments of the techniques we describe the layer of organic material has a spin lifetime longer than 10 nanoseconds, more preferably longer than 100 nanoseconds and most preferably longer than 1 microsecond.

In a related aspect the invention provides a method of detecting a voltage from a spin-current, wherein said spin-current comprises a current having a spin predominantly aligned in a spin direction, the method comprising: generating a voltage in an organic material using the Inverse Spin Hall Effect; and detecting said generated voltage.

The invention also provides a spin-current-to-charge-current or charge-current-to-spin-current conversion device comprising an organic conversion part, wherein said organic conversion part generates an electromotive force perpendicular to a spin or charge current, respectively, flowing through the organic conversion part and has an anisotropic electrical conductivity such that the electrical conductivity parallel to said electromotive force is greater than the electrical conductivity perpendicular to said electromotive force.

Typically the spin-current will not flow further than a distance of 1-10 μm and thus in embodiments the spin-to-charge conversion part comprises typically a film of organic conductor or semiconductor as previously described. In embodiments the device includes a spin-current generation part, or layer, adjacent or in contact with the spin-to-charge conversion layer, to provide the spin current.

More generally the spin-to-charge conversion device is used as the readout stage for a spintronics device such as a memory element, spin-based diode, spin-based transistor, spin-based logic device or the like. One of the advantages of using organic materials is that it is straight forward and cost-effect to fabricate a large-area or bulk spintronic device, and thus in embodiments the organic layer of the spin-to-charge conversion device has a lateral dimension of at least 1 mm or 10 mm. For example the device may be fabricated on a flexible substrate in combination with one or more other spintronic devices to provide a flexible, organic spintronic circuit.

One particular application for the above described architecture is in a spin-Seebeck thermoelectric power source. In such a device a magnetic material, for example a layer of magnetic material, is provided adjacent the organic layer to generate a magnetic field having at least a component in the lateral direction within the film. In use the device is arranged with electrodes to provide a voltage from an electric field which is perpendicular to (a component of) the direction of the induced spin polarization and also perpendicular to (a component of) a temperature gradient applied to the device. The skilled person will understand that one or more electrodes are positioned spaced apart in the direction along that defined by the electric field (electromotive force).

In one approach both the direction of spin polarization (defined, for example by an applied magnetic field or the magnetization in an adjacent ferri- or ferromagnetic layer and the temperature gradient are aligned in a lateral direction within the device; in a second approach the direction of spin polarization is aligned in the lateral, in-plane direction and the temperature gradient is aligned in the vertical, through-plane direction. This second approach is particularly preferable because the spin current flows in the vertical direction (in the first approach the spin current is in-plane in the lateral direction). Then the desired anisotropy that is, low conductivity in the vertical, spin current direction and higher conductivity in the lateral direction matches the natural conductivity and anisotropy of a conducting polymer material deposited in one or more layers.

Thus in a further related aspect the invention provides a spin-Seebeck thermoelectric converter, comprising: a magnetic spin current generator to provide a spin current; and an organic spin-to-charge converter coupled to said spin current generator to generate an electrical current from said spin current; wherein said spin-to-charge converter comprises a layer of organic material with an anisotropic electrical conductivity, having a greater electrical conductivity in a lateral direction within the layer than in a vertical direction across the layer.

In some preferred embodiments the spin-current generator comprises a transition metal-doped metal oxide. This is particularly compatible with the fabrication techniques typically used for depositing the layer of organic material.

Even though it may be preferential to exploit organic (semi-)conductors as spin-to-charge converters as they tend "naturally" to have the desired electrical conductivity anisotropy, the benefit of a high conductivity anisotropy may give rise to an enhanced spin-current to charge-current conversion in inorganic materials as well.

Another aspect of the invention therefore provides a spintronic device comprising: a spin current generation member layer that generates a pure spin current or a spin-wave spin current by supplied energy; a spin current-electric current mutual conversion member layer that is connected to the spin current generation member layer and converts a spin current into an electric current or the electric current into the spin current; and a pair of electrodes that is provided on the spin current-electric current mutual conversion member layer, on an upstream side and on a downstream side in a flowing direction of the electric current, wherein the spin current-electric current mutual conversion member layer has an anisotropic conductivity whose electric conductivity in a flow-in direction of the spin current is lower than the electric conductivity in other directions.

In some preferred embodiments of the spintronic device the spin current generation member layer comprises a magnetic substance layer, and the spin current-electric current mutual conversion member layer comprises an inverse spin Hall effect member layer.

In some embodiments, the supplied energy may comprise any one of heat, a microwave, light, and a sound wave.

In a preferred embodiment, the inverse spin Hall effect member layer is provided on an insulating substrate, and the magnetic layer is provided on the inverse spin Hall effect member layer. Alternatively, the magnetic layer is provided on an insulating substrate, and the inverse spin Hall effect member layer is provided on the magnetic layer.

In one embodiment of the spintronic device, the spin current generation member layer comprises a semiconductor layer having sphalerite type crystal structure, wherein the spin current-electric current mutual conversion member layer comprises an inverse spin Hall effect member layer, and wherein the supplied energy comprises circularly polarized light.

In another embodiment of the spintronic device, the spin current generation member layer comprises a magnetic substance layer, wherein the spin current-electric current mutual conversion member layer comprises a spin Hall effect member layer, and wherein the supplied energy comprises an injection current.

The spin current-electric current mutual conversion member layer having the anisotropic conductivity may comprise any one of a conductive polymer, an organic self-organized film, an organic charge-transfer complex conductor, a metal laminated film, a layered transition metal oxide, and a three-dimensional topological insulator. The conductive polymer may comprise PEDOT:PSS as a polymer mixture of PEDOT and PSS, or PBTTT:F4-TCNQ as a polymer mixture of PBTTT and F4-TCNQ.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Figure 1A:
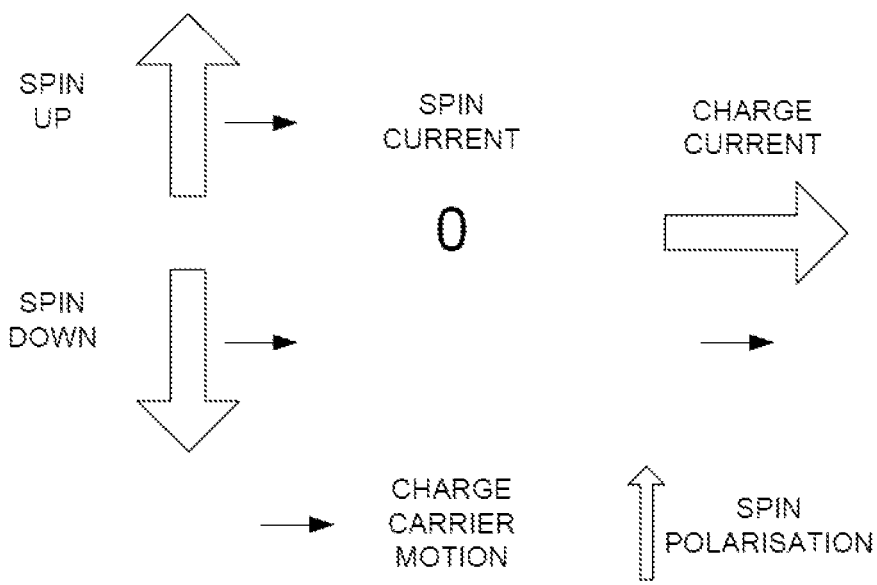
FIGS. 1a to 1c show, respectively, an example of a charge current with zero spin-current, an example of a spin current with zero charge current, and spin-charge conversion in organic material according to an embodiment of the invention.
Figure 1B:
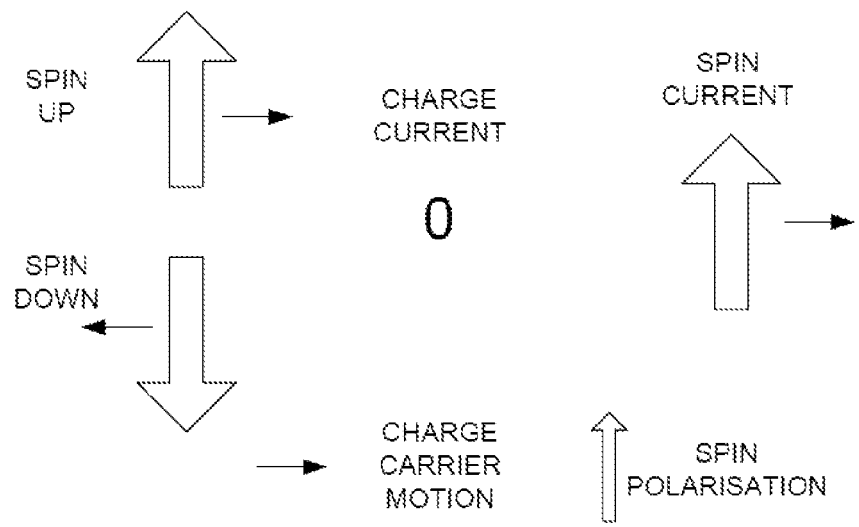

In a conventional electrical charge current, as shown in FIG. 1a, the spin components may cancel giving rise to a net zero spin current. Alternatively, as illustrated in FIG. 1b, charge carriers with opposite spin may travel in different directions giving rise to a flow of spin, or spin current, with zero accompanying charge current. Intermediate situations may also exist in which there is a spin-polarised charge current. Spin and charge currents may be in different directions, for example perpendicular to one another. Spintronic devices process spin currents (which may or may not be accompanied by a charge current), but there is a need to read out data from such devices. One way in which this can be done is using a spin-to-charge conversion device.

In a further aspect of the invention a spintronic device comprises a layer which generates either the spin current or spin-wave spin current. The device also comprises a layer that is able to convert the spin current to a charge current or vice versa. The two layers are stacked. One pair of electrodes is placed onto or under the latter, conversion layer, and is placed along the charge current direction. The latter spin-charge conversion layer has a high, anisotropic conductivity, where the electrical conductivity along the charge current output direction is higher than that along other directions.

It is demonstrated that the spin Hall angle, $\theta_{SHE}$, which corresponds to the conversion efficiency from the spin current to charge current, is defined as $\theta_{SHE}=(\sigma_y/\sigma_x)\alpha_H$, where $\sigma_x$ is the electrical conductivity along the spin current input direction and $\sigma_y$ is the electrical conductivity along the charge current output direction. In a normal conductor which doesn't show a conductivity anisotropy, $\theta_{SHE}$ is equivalent to $\alpha_H$ since $\sigma_x=\sigma_y$. However, it is possible to enhance the spin current to charge current conversion efficiency defined as $\alpha_H$ (conventionally ~10%) to more than 100% by using materials for which $\sigma_y > \sigma_x$.

Examples of materials that potentially exhibit such a high anisotropic conductivity are conducting polymers, organic self-assembled layers, organic charge-transfer complex conductors, metallic multilayers, layered transition metal oxides, and three-dimensional topological insulators. In particular, PEDOT:PSS which is a mixture of PEDOT and PSS, or PBTTT:F4-TCNQ, which is a mixture of PBTTT and F4-TCNQ are the potential candidates.

The conversion layer having a high conductivity anisotropy is placed either on top of or below the ferromagnetic layer.

As shown in more detail below, using this proposed spintronic device makes it possible for the conversion efficiency from spin current to charge current to exceed $\alpha_H$.

We will describe the realization of efficient solution-processed, organic spin-charge converters. We show that a pure spin current can be produced in a solution-processed conducting polymer by pumping of spins through exciting ferromagnetic resonance in an adjacent magnetic insulator and that this pure spin current generates an electric voltage across the polymer film. We demonstrate that all experimental characteristics of the generated voltage are fully consistent with it being generated by the inverse spin Hall effect in the conducting polymer. In contrast to inorganic materials, the conducting polymer displays coexistence of high spin-current to charge-current conversion efficiency and long spin lifetime. Our discovery not only provides a basis for studying the process of spin-charge conversion in organic materials, but also opens a route for a new generation of molecular-structure-engineered spintronic devices, that could lead to important advances in plastic spintronics.

Since spin-charge conversion in organic materials is likely to involve detection of small, submicrovolt voltage signals, it is important to choose an experimental configuration that allows generation of a pure spin current in the organic material without potential electromagnetic artifacts. The most common method for spin injection into organic semiconductors has been electrical injection from spin-polarized, ferromagnetic metal contacts. However, these experiments require application of relatively large voltages between the metal and the organic semiconductor, which would render detection of any small voltage signals generated by spin-charge conversion difficult. However, from these experiments it is known that spin-exchange coupling at the interface between a ferromagnet and an organic semiconductor is efficient. This suggests the possibility of generating spin currents in an organic semiconductor by exciting magnetization precession in an adjacent ferromagnetic material, i.e. spin pumping at a ferromagnetic/organic interface, which has allowed spin injection into a broad range of inorganic materials. Spin pumping has not yet been observed in organic materials, but it should allow injection of spin currents without application of an external voltage to the sample. What is particularly attractive is that the process can be applied not only to ferromagnetic metals but also to magnetic insulators. By selecting a magnetic insulator for spin pumping, it is possible to eliminate potential experimental artifacts, such as voltage generation by anisotropic magnetoresistance, anomalous Hall effect, backflow of spins in the ferromagnet, or shunting contributions from current flow in the ferromagnet that can arise in spin pumping experiments with ferromagnetic metals such as permalloy. Exploiting a magnetic insulator instead provides the cleanest experimental configuration for studying spin-charge conversion and has therefore been selected for our experiments.

Figure 1C:
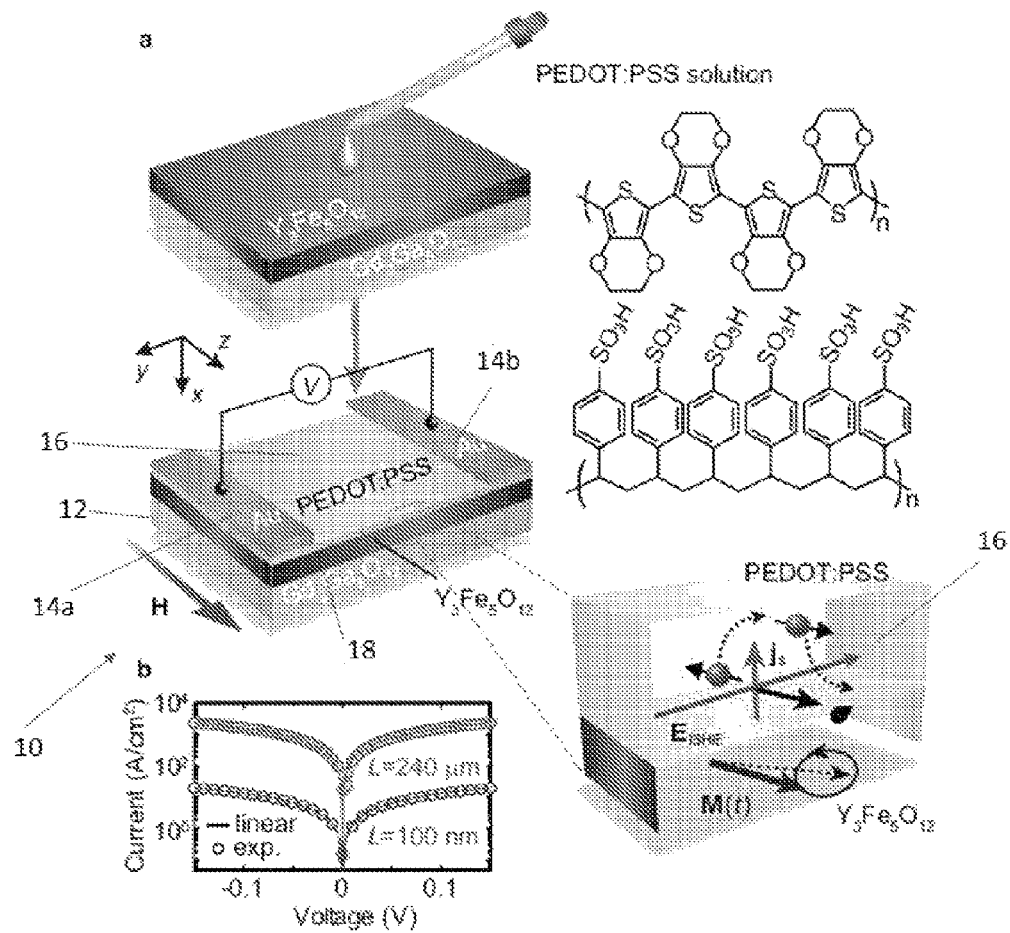

Here we investigate spin-charge conversion in a solution-processed conducting polymer, poly(3,4-ethylenedioxythiophene):poly(4-styrenesulfonate) (PEDOT:PSS) 16 by voltage generation from a spin-current injected from an adjacent magnetic insulator 18, $Y_3Fe_5O_{12}$. The experimental configuration is shown in FIG. 1c. PEDOT:PSS is a widely used, thiophene-based conducting polymer, which exhibits a high in-plane conductivity of around $10^3$ Scm$^{-1}$ (see Example B) due to p-type doping of PEDOT by PSS. This high conductivity allows for low-noise, high sensitivity ISHE measurements; low resistivity materials exhibiting a high charge density are required to increase the signal-to-noise ratio. A significant charge density in the organic material is also needed to provide efficient spin pumping at the interface. The solution processability and relatively easy molecular optimization of structure-property relationships offered by organic materials could enable the use of spintronic devices in new, flexible, large area and potentially low-cost applications. $Y_3Fe_5O_{12}$ is a ferrimagnetic insulator with a band-gap of 2.7 eV and a very high resistivity (~$10^{12}$ Wcm at room temperature, greater than that of air and much higher than that of PEDOT:PSS).

In the illustrated example, the organic layer comprises a PEDOT:PSS 16 film spin-coated onto the $Y_3Fe_5O_{12}$ substrate 18. However there are very many other organic conducting and/or semiconducting materials which may be employed, doped or undoped. As schematically illustrated, PEDOT and PSS tend to form layers in which the conjugated polymer chains lie in-plane, providing relatively better conduction, and in which the PSS layers provide quasi-insulating interleaving layers, so that conduction in a vertical direction is relatively weak, hopping conduction.

In the illustrated example, the spin current is generated by the layer of magnetic material 18, driven by a source of microwave radiation (not shown). Here the layer of magnetic material comprises $Y_3Fe_5O_{12}$, but other magnetic materials may be used. The spin current js is polarized parallel to the magnetic field H of the $Y_3Fe_5O_{12}$ and flows vertically through the device (note that no electrical charge current flows in this direction in this embodiment). This is merely a convenience to generate a spin current to characterize and test the device—the layer of magnetic material and microwave electromagnetic field comprise one implementation of a spin current generator but are not a necessary part of the spin-to-charge conversion device.

The expanded portion of FIG. 1c illustrates, schematically, the mechanism of operation of the device. H and M(t) denote the external magnetic field and dynamical magnetization, respectively. $E_{ISHE}$, js, and σ denote the electric field due to the spin-charge conversion, the flow direction of the spin current, and the spin-polarization vector of the spin current, respectively. This part of the Figure illustrates that charge carriers with spins aligned parallel to H tend to move "down" (in the direction of js), and those with spins aligned antiparallel to H tend to move "up" (opposite to js), as well as becoming laterally displaced from one another.

The single-crystal $Y_3Fe_5O_{12}$ film (3×5 mm$^2$) with a thickness of 5 mm was grown on a $Gd_3Ga_5O_{12}$ substrate 12 by liquid phase epitaxy. The PEDOT:PSS film with a thickness of d=80 nm was spin-coated from a water-based ink onto the $Y_3Fe_5O_{12}$ film and two Au contacts 14a, 14b were deposited onto the PEDOT:PSS layer (for details, see Example A). For the PEDOT:PSS film, electrical conductivities for both out-of-plane (x-) and in-plane (y-) directions were measured to be $\sigma^x_c=1.6\times10^{-3}$ Scm$^{-1}$ and $\sigma^y_c=660$ Scm$^{-1}$ by four-point-probe current-voltage measurements as shown in FIG. 1c (see also Example B). The large conductivity anisotropy reflects the high degree of polymer alignment in the plane of the film that is commonly found in conjugated polymer thin films. We induced ferromagnetic spin-wave resonance (FMR) in the $Y_3Fe_5O_{12}$ film and measured the DC electric-potential difference between the Au electrodes on the PEDOT:PSS layer that was generated by exciting FMR. For clarity we refer to this voltage already at this point as $V_{ISHE}$. However, we emphasize that this nomenclature was by no means adopted as a foregone conclusion. It is based on a careful and detailed experimental analysis that tests this hypothesis and forms the heart of the present paper. Under FMR conditions, the spin pumping injects a pure spin current into the PEDOT:PSS layer. If the spin current $j_s$ can be converted into a charge current $j_c$ through the ISHE in the PEDOT:PSS layer, this spin current should give rise to a DC electric voltage between the two gold electrodes (see FIG. 1c). For the measurements, the PEDOT:PSS/$Y_3Fe_5O_{12}$ film was placed at the center of a $TE_{011}$ microwave cavity with a resonance frequency of $f=9.45$ GHz, in which the microwave magnetic field was applied along the y direction. An external static magnetic field H was applied along the film plane as shown in FIG. 1c. All measurements were performed at room temperature.

Figure 2:
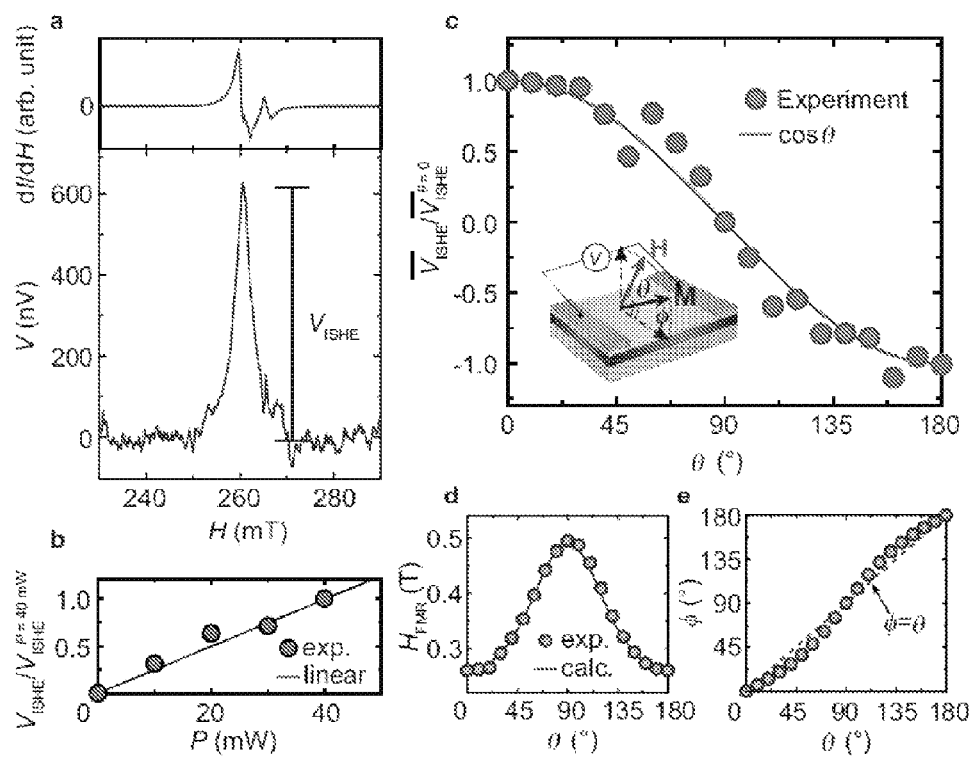
FIG. 2 shows observation of spin-charge current conversion in the conducting polymer PEDOT:PSS.

FIG. 2a shows the microwave absorption and the DC electromotive force $V_{ISHE}$ signals for the PEDOT:PSS/$Y_3Fe_5O_{12}$ film, respectively. In the voltage spectrum, a voltage signal appears at the resonance field $H_{FMR}=260$ mT, indicating that the electric voltage is induced in the PEDOT:PSS layer concomitant with the FMR. The magnitude of the detected electric voltage $V_{ISHE}$ increases with the microwave excitation power P as shown in FIG. 2b. This is consistent with the prediction of the spin pumping from the $Y_3Fe_5O_{12}$ film; the spin pumping intensity is proportional to the number of excited magnons, or microwave excitation power. Although the shape of the ferromagnetic resonance for the $Y_3Fe_5O_{12}$ film is somewhat complicated due to presence of several side FMR resonances, as commonly found for this material, it is clear that the voltage signal exhibits a predominantly symmetric shape around the resonance field, as expected for a voltage generated by the ISHE in the conducting polymer.

We measured the dependence of the electric voltage on the out-of-plane angle Q between the substrate plane and the static magnetic field H as defined in the inset of FIG. 2c. The field angle Θ dependence of the electric voltage $\hat{V}_{ISHE}=V_{ISHE}/P_{abs}$ is shown in FIG. 2c, where $P_{abs}$ is the absorbed microwave intensity at FMR. The $\hat{V}_{ISHE}$ signal disappears at Σ=90° and sign of the voltage is reversed by further increasing Θ, which is also consistent with the symmetry of the ISHE. Here, the spin polarization s of the injected spin current at the interface is directed along the magnetization precession axis. The angle f of the magnetization precession axis with respect to the film plane is obtained from the Q dependence of the resonance field $H_{FMR}$ (FIG. 2d) using the Landau-Lifshitz-Gilbert equation as shown in FIG. 2e. FIG. 2e shows that the magnetization-precession axis is almost parallel to H, Q≈f, because of the small demagnetization field in the $Y_3Fe_5O_{12}$ layer, and thus the effect of spin precession around H in the PEDOT:PSS layer on $V_{ISHE}$ is negligible. If the voltage signals were generated by the ISHE, we would expect $E_{ISHE}||j_s\times s$, and with $j_s \alpha P_{abs}$ this would result in $\hat{V}_{ISHE} \alpha |j_s\times s|/P_{abs} \alpha \cos f \approx \cos Q$. The experimental data are again fully consistent with this expectation.

Figure 3:
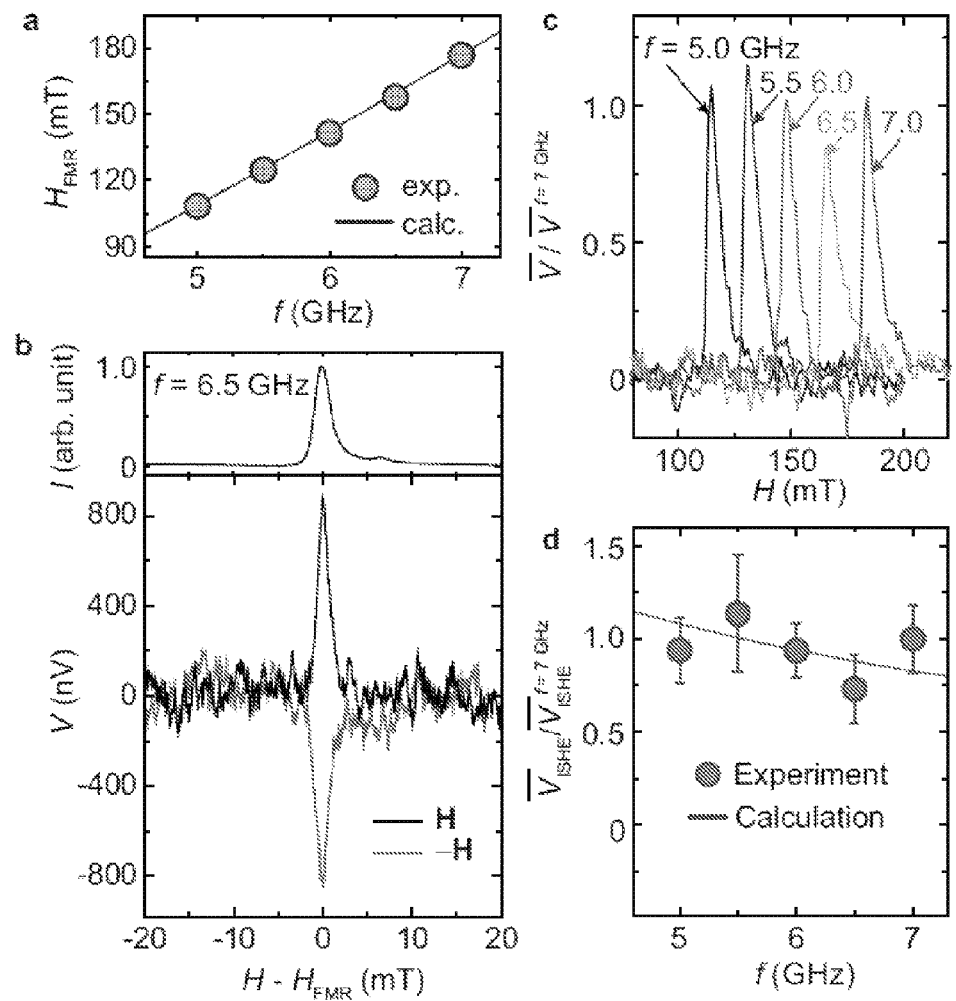
FIG. 3 shows microwave frequency dependence of electric voltage.
Figure 4:
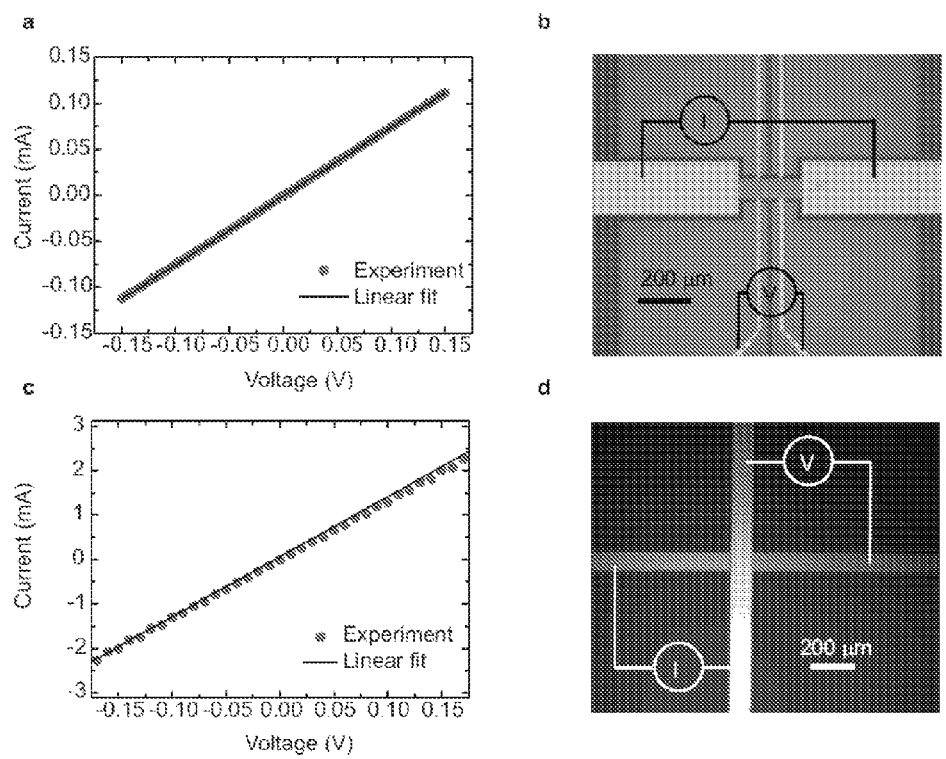
FIG. 4 shows the current-voltage (I-V) characteristics of PEDOT:PSS.

We emphasize again that $Y_3Fe_5O_{12}$ is an insulator. Nevertheless, voltage signals appear in the PEDOT:PSS/$Y_3Fe_5O_{12}$ film. This clearly shows that the observed electric voltage is induced in the PEDOT:PSS layer. We found that the organic magnetoresistance (OMAR) in the PEDOT:PSS film is vanishingly small, less than 0.1%, showing that the OMAR is not responsible for the observed voltage (Example D). Therefore, the only potential, alternative origin of the $V_{FMR}$ signals, except for the spin-pumping-induced ISHE, in the PEDOT:PSS/$Y_3Fe_5O_{12}$ film is a thermoelectric effect, including field H dependent and independent effects, induced by the microwave absorption in the PEDOT:PSS/$Y_3Fe_5O_{12}$ film. However, we found that thermoelectric effects are unlikely to be the cause of the detected voltage signal. Most importantly, the detected voltage reverses its sign when reversing H. This is consistent with the expected ISHE symmetry, but excludes H-independent thermoelectric effects, such as the Seebeck effect, from contributing to the signal. Furthermore, we found that the voltage signal is insensitive to the external magnetic field strength, $H_{FMR}$, showing that H-dependent thermoelectric effects, i.e., the Nernst effect, are also irrelevant to the observed voltage signal. To investigate the $H_{FMR}$ dependence of the detected voltage, we measured the electric voltage for the PEDOT:PSS/$Y_3Fe_5O_{12}$ film using a coplanar waveguide, where the microwave frequency $f$ can be controlled. This enabled us to vary the resonance field $H_{FMR}$ as shown in FIG. 3a. Here, the relation between $f$ and $H_{FMR}$ is given by the Kittel formula:

$$f=(\gamma/2\pi)\sqrt{H_{FMR}(H_{FMR}+4\pi M_s)}$$

FIG. 3b shows the V signals for the PEDOT:PSS/$Y_3Fe_5O_{12}$ film measured with applying an in-plane magnetic field H perpendicular to the direction across the electrodes and a microwave with a frequency of $f=6.5$ GHz, showing again that the observed electric voltage changes sign upon reversing the magnetic field direction from H to −H in this system. The voltage signal, which is asymmetric to H, disappears when the H direction is parallel to the direction across the electrodes, consistent with the symmetry of the ISHE induced by the spin pumping, since the ISHE, $E_{ISHE} \parallel j_s \times s$, predicts that the electric voltage is induced perpendicular to s, or H. FIG. 3c shows the voltage spectra for the PEDOT:PSS/$Y_3Fe_5O_{12}$ film measured at various microwave frequencies $f$. As shown in FIG. 3c, the magnitude of $\tilde{V}=V/P_{abs}$ is almost independent of $H_{FMR}$, which is evidence that the observed voltage signals cannot be attributed to the Nernst effect; the Nernst effect predicts $\tilde{V}_{ISHE}$ $V_{ISHE}/P_{abs}$ $\alpha_{abs}H_{FMR}$, since the electric voltage due to the Nernst effect at FMR is proportional to $|\nabla T \times H_{FMR}|=|\nabla T|H_{FMR}$ and the magnitude of the temperature gradient $|\nabla T|$ is proportional to the absorbed microwave intensity $P_{abs}$ at FMR. These results demonstrate that electromagnetic and thermoelectric artifacts are irrelevant to the observed voltage.

Indeed, the observed microwave frequency dependence of the electric voltage shown in FIG. 3c is consistent with the prediction of the spin pumping and ISHE. The direct current component of a spin current generated by the spin pumping is proportional to the z component of the magnetization damping: $j_s \alpha [M' \times \partial_t M']_z \alpha f W$, where $M'=M/M_s$ and $M_s$ is the saturation value of the magnetization M. W is the solid angle of the magnetization precession trajectory. Here, W decreases with increasing $f$, since the cone angle of magnetization precession decreases with increasing $f$ or $H_{FMR}$, showing that $j_s \alpha f W$ is insensitive to $f$. Using the Landau-Lifshitz-Gilbert equation, the $f$ dependence of $V_{ISHE}$ is expressed as $$\tilde{V}_{ISHE} \propto [(4\pi M_s \gamma)^2 + (4\pi f)^2]^{-1/2}$$

where $g=1.78 \times 10^{11}$ $T^{-1}$ $s^{-1}$ is the gyromagnetic ratio and 4p $M_s=0.175$ T is the saturation magnetization of the $Y_3Fe_5O_{12}$ film. As shown in FIG. 3d, the experimentally measured $f$ dependence of $\tilde{V}_{ISHE}$ is well reproduced using this calculation.

We found that the magnitude of the electric voltage, $V_{ISHE}$, increases with decreasing the thickness d of the PEDOT:PSS layer. This is because thicker PEDOT:PSS films tend to short-circuit signals generated near the interface. This result is consistent with the prediction of the ISHE induced by the spin pumping because the ISHE voltage is generated in an interfacial layer with a thickness which is determined by the spin diffusion length of the PEDOT:PSS layer. The d dependence of $V_{ISHE}$ for d>1 is approximated to be $V_{ISHE}$ $\alpha (1/d)$ tan $h(d/l)$ tan $h(d/2l)$, where l is the spin diffusion length in the PEDOT:PSS layer (see also equation (1)). The experimentally observed increase of $V_{ISHE}$ is around 15-45% when d is decreased from 80 to 40 nm (for details, see Methods). From this, we can estimate the spin diffusion length in the PEDOT:PSS layer to be on the order of l=22~31 nm. If we assume the diffusion coefficient in the PEDOT:PSS layer to be on the order of $D=8 \times 10^{-7}$ $cm^2$ $s^{-1}$ (Example B), the estimated spin relaxation time becomes $t_s=5$~11 ms, which is consistent with previous reports on long spin relaxation times in organic semiconductors. The error in our estimate of l is relatively large, because a more accurate determination of l from a fit of voltage measurements on PEDOT:PSS films with many different thicknesses was found to be experimentally challenging because samples of $Y_3Fe_5O_{12}$ prepared in different deposition runs exhibited slightly different FMR resonance field and shape (see Method section). This is a well-known problem with $Y_3Fe_5O_{12}$ which led to nominally identical samples of the same PEDOT:PSS thickness exhibiting variations in the magnitude of the voltage signal on the order of 10%. This made a more accurate comparison between samples of different thickness difficult.

We can summarize our experimental observations by stating that the voltage generated in the PEDOT:PSS/$Y_3Fe_5O_{12}$ films exhibits all the same experimental characteristics as that previously observed in the same experiment on a range of inorganic semiconductors, such as GaAs and Si, and metals, such as Pt. In particular, the angle, power and frequency dependence of the voltage generated in PEDOT:PSS/$Y_3Fe_5O_{12}$ are fully consistent with the theory of spin pumping and the ISHE. We also emphasize again that by using a magnetic insulator for spin pumping, we have minimized the potential for electromagnetic artifacts. We conclude therefore that we have proven beyond reasonable doubt that the observed voltage signal is indeed generated by the ISHE in the conducting polymer.

The magnitude of $V_{ISHE}$ in PEDOT:PSS/$Y_3Fe_5O_{12}$ is about two orders of magnitude smaller than that in a Pt/$Y_3Fe_5O_{12}$ film. Pt is well known to exhibit a high spin-charge conversion efficiency because of its strong spin-orbit interaction, and may therefore serve as a useful reference system. We confirmed the absence of heavy metals in the PEDOT:PSS film by X-ray photoelectron spectroscopy (Example E), showing that the signal in the PEDOT:PSS/$Y_3Fe_5O_{12}$ film is not induced by impurity scattering due to heavy-metal contamination. In order to interpret our result in terms of possible mechanisms for the spin-charge conversion in organic materials, it is important to consider separately the two factors that influence the magnitude of $V_{ISHE}$: the spin accumulation $\delta\mu(x)$ induced by the spin pumping and the spin Hall angle $Q_{SHE}$ in the PEDOT:PSS layer. Here, the spin Hall angle is defined as $\Theta_{SHE}=E_{ISHE}(x)/E_s(x)$, where $E_{ISHE}(x)$ is the electric field induced by the ISHE, and $E_s(x)=-(1/e)\nabla \delta\mu(x)$ is the driving field of spin currents: $j_s(x)=\sigma^x_c E_s(x)$, where $\sigma^x_c$ is the electrical conductivity of the PEDOT:PSS layer along the x direction. With the spin Hall angle $\Theta_{SHE}$ and the DC spin accumulation at the interface $\delta\mu(x=0)=\delta\mu_0$, the magnitude of the ISHE voltage is expressed as $$V_{ISHE}=\Theta_{SHE}(w/d)(1/e)\tan h(d/2\lambda)\tan h(d/\lambda)\delta\mu_0, \qquad (1)$$

where w is the length of the $Y_3Fe_5O_{12}$ layer along the y direction. This equation shows that $V_{ISHE}$ is proportional to $\Theta_{SHE}$ and $\delta\mu_0$ (see also Methods).

We first consider the spin accumulation induced by the spin pumping in the PEDOT:PSS layer. The spin accumulation $\delta\mu(x)$ induced by the spin pumping is obtained from the Bloch equation for carrier spins in the PEDOT:PSS layer, in which the exchange torque arising from the spin-exchange coupling at the interface as well as the spin diffusion are taken into account $$\delta\mu(x) = \frac{\hbar}{4} \frac{\cosh[(d-x)/\lambda]}{\sinh(d/\lambda)} \frac{\tanh(d/\lambda)}{1+\Gamma^2\tanh^2(d/\lambda)}\left[\hat{M} \times \frac{\partial \hat{M}}{\partial t}\right]_x, \qquad (2)$$

where $\Gamma=(\tau_{ex}/\tau_s)$ $(1/a_{eff})$. Here, $\tau_{ex}=\hbar/(S\ J_{sd})$, S is an effective block spin per unit cell in the $Y_3Fe_5O_{12}$ layer, and $J_{sd}$ is the strength of the spin-exchange coupling between the magnetization and carrier spins at the interface. $a_{eff}=v_e/a_s^2$ is the effective interaction range, where $v_e$ is the volume per carrier and $a_s$ is the lattice constant of localized spins at the interface. In a Pt/YIG film, G~20 and thus $$\delta\mu_0^{Pt} \cong (\hbar/4)\Gamma^{-2}[\hat{M}\times\partial_t\hat{M}]_z$$

because of tan $h^2(d/\lambda) \approx 1$ for $d > \lambda$ and $\Gamma^2 \gg 1$. In contrast, in the PEDOT:PSS/YIG film, $\Gamma \sim 0$ because of the exceptionally long spin lifetime $\tau_s$ (for details, see Methods) giving rise to a large spin accumulation $$\delta\mu_0^{PEDOT:PSS} \cong (\hbar/4)[\hat{M}\times\partial_t\hat{M}]_z$$

in the PEDOT:PSS layer. We estimate the spin accumulation could be higher by about a factor of $4\times10^2$ in PEDOT:PSS than in Pt.

Next we consider the spin Hall angle $Q_{SHE}$ in the PEDOT:PSS film. Using equation (1) with $V_{ISHE}^{PEDOT:PSS}/V_{ISHE}^{Pt} \sim 10^{-2}$ and $\delta\mu_0^{PEDOT:PSS}/\delta\mu_0^{Pt} \sim 4\times10^2$, we find that the spin Hall angle in the PEDOT:PSS film is much smaller than that in the Pt film: $\theta_{SHE}^{PEDOT:PSS}/\theta_{SHE}^{Pt} \sim 10^{-5}$, where d=10 nm and $\lambda$=7 nm for the Pt/$Y_3Fe_5O_{12}$ film, and d=80 nm and $\lambda$=30 nm for the PEDOT:PSS/$Y_3Fe_5O_{12}$ film were used for the calculation. This result shows that the spin Hall angle in the PEDOT:PSS film is on the order of $\theta_{SHE}^{PEDOT:PSS} \sim 10^{-7}$ because of $\theta_{SHE}^{Pt} \sim 10^{-2}$. Such a small value of $\Theta_{SHE}$ could be consistent with the ISHE being caused by the weak spin-orbit interaction in the organic material. The spin-orbit interaction is expected to scale approximately with the fourth power of the nuclear charge. Explicit estimates of the strength of the spin-orbit coupling in carbon-based materials such as graphene and polyacetylene indicated that the spin-orbit coupling parameter is indeed about four orders of magnitude weaker in these materials than in inorganic materials such as GaAs and Pt. For doped conducting polymers, no such estimates are available, but PEDOT:PSS is of course relatively similar in elemental composition and electronic structure (although the presence of heavier sulphur atoms may act to enhance the spin-orbit coupling somewhat). Charge transport in PEDOT:PSS is still not fully understood and is described by some authors as hopping transport, while other studies have obtained evidence for metallic transport at the Fermi level. In-depth theoretical studies of the spin-charge conversion in PEDOT:PSS will undoubtedly be stimulated by the results reported in this work. These should clarify whether extrinsic skew scattering and side jump theories that have been proposed for doped inorganic semiconductors, such as GaAs, could be extended to describe the metallic transport properties of doped, conducting polymers, such as PEDOT:PSS, or whether a hopping transport framework needs to be adopted to describe the ISHE in these disordered media. To date, there has only been very limited, theoretical work on the spin Hall physics of hopping systems. It has been argued that by taking into account spin-dependent phase factors when calculating transition probabilities for clockwise and anti-clockwise three-site hopping processes, it is possible to account for a finite spin Hall conductivity in a (two-dimensional) hopping system. In the context of our experimental study, it appears inappropriate at this stage to speculate further about the detailed physical mechanism responsible for the ISHE in PEDOT:PSS. The purpose of the present analysis has been to emphasize that the magnitude of the observed effect is not necessarily inconsistent with the ISHE being caused by the relatively weak spin-orbit coupling in organic materials. Our analysis suggests that the effect may only be observable in the present system because of a large spin accumulation in the organic material enabled by a long spin lifetime. However, we would like to emphasize that in spite of the small spin Hall angle $\Theta_{SHE}$, the conversion from the injected out-of-plane spin current $j_s(x)$ to the in-plane charge current $j_c(x)$ is actually quite efficient owing to the large conductivity anisotropy in the PEDOT:PSS films. Although a large spin accumulation is induced in the PEDOT:PSS layer, the spin current density $j_s = -(\sigma_c^x/e)\nabla\delta\mu(x)$ in the PEDOT:PSS film is much smaller than that in Pt because the spin current generated by the spin pumping flows along the low mobility direction ($\sigma_c^x = 1.6\times10^{-3}$ Scm$^{-1}$). However, the charge current $j_c = \sigma_c^y V_{ISHE}/w$ induced by the ISHE is relatively large because it flows along the high mobility direction ($\sigma_c^y = 660$ Scm$^{-1}$). Once the carriers responsible for the spin current are scattered into the in-plane direction, they are transported with greater mobility and give rise to a large flux of charge transverse to the spin current. We can deduce that the conversion efficiency $\alpha_{ISHE}$ from a spin current $j_s(x)$ into a charge current $j_c(x)$, $$\alpha_{ISHE} = j_c(x)/j_s(x) = [\sigma_c^y E_{ISHE}(x)]/[\sigma_c^x E(x)] = (\sigma_c^y/\sigma_c^x) \theta_{SHE},$$

is enhanced over the spin Hall angle $\Theta_{SHE}$ by the conductivity anisotropy. The conductivity anisotropy factor ($\sigma_c^y/\sigma_c^x$) in the PEDOT:PSS film is significantly large: $\sigma_c^y/\sigma_c^x = 4\times10^5$, which gives rise to $\alpha_{ISHE} \sim 4\times10^{-2}$. This demonstrates the efficient conversion from a spin current to a charge current in the PEDOT:PSS film; the corresponding spin-charge conversion efficiency $\alpha_{ISHE}$ in the PEDOT:PSS film is in fact comparable to that in the Pt film. Therefore, an efficient conversion efficiency $\alpha_{ISHE}$ from a spin current into a charge current can be realized even in a material with weak spin-orbit coupling but large conductivity anisotropy.

Figure 10:
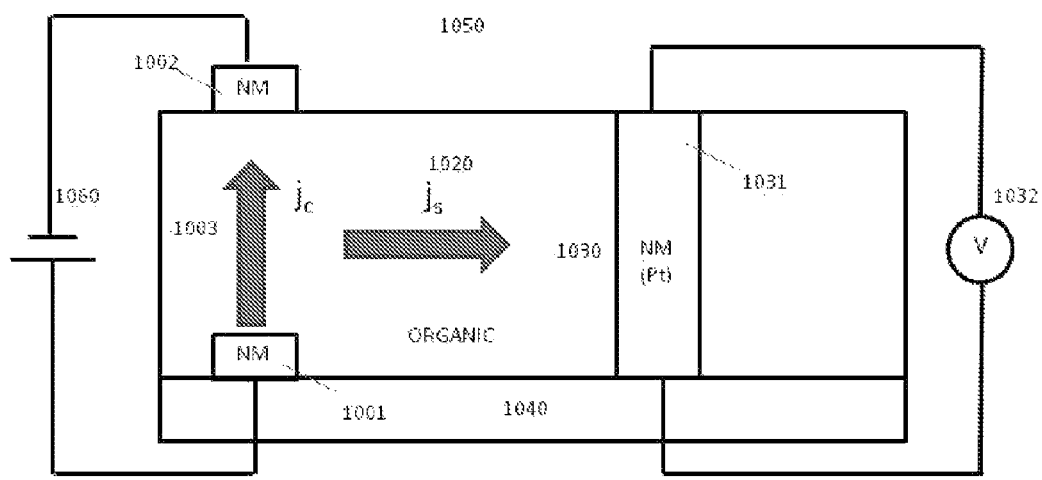
FIG. 10 illustrates an example of a device allowing for direct examination of the charge current to spin current conversion efficiency in the organic material.

In the ISHE configuration described in FIG. 1(c) the conductivity anisotropy does not directly enhance the measured voltage which, to first order, is independent of the conductivity anisotropy (see Methods section). In other device configurations, however, in which the spin and charge currents are more directly measured the enhancement of the spin current to charge current conversion by the conductivity anisotropy results directly in a larger measured signal. An example is shown in FIG. 10. This particular structure relies on the spin Hall effect in the organic material, i.e. the conversion of a charge current to a spin current. The spin Hall effect and the inverse spin Hall effect in a material are very closely related and rely on the same physical spin-orbit mechanism (see, for example, Saitoh et al., Appl. Phys. Lett. 88, 182509 (2006)). Therefore the spin Hall effect is also observable in organic materials. In the device 1050 of FIG. 10 a first, charge current generator region 1003 of the device comprises non-magnetic electrodes 1001 and 1002 spaced apart in an out-of-plane direction and connected to a charge current generator 1060, mounted on an insulating, for example glass, substrate 1040. This generates a charge current which flows through the layer of organic material 1020 and is converted into a spin current perpendicular to said charge current via the spin Hall effect in region 1003 of the device. Said spin current decays with increasing distance from region 1003 towards region 1030 of the device, which comprises an electrode 1031 with known spin-charge current conversion efficiency, which generates a voltage 1032, as previously described. The voltage 1032 is directly proportional to the spin current injected into electrode 1031. If the charge current injected into the organic material flows along the low conductivity vertical direction and the spin current is induced along the high conductivity lateral direction, the conductivity anisotropy directly enhances the measured signal.

The observed conversion of a flow of spins into an electric voltage provides a route for the direct measurement of spin information in conducting polymers and opens new opportunities for realizing plastic spintronic devices that benefit from the compatibility of organic materials with large-area, solution-based processing. The almost-infinite chemical tunability of organic materials pave the way towards molecular-structure engineering and deeper fundamental scientific understanding of spin-charge conversion in condensed matter.

The benefit of a high conductivity anisotropy should in fact be a general feature of the spin-current to charge-current conversion even in inorganic materials, but it is a particularly important and practical pathway for enhancing the efficiency of spin-current to charge-current conversion with organic materials. This is because, as discussed below, the conductivity anisotropy of organic materials can easily be tuned over orders of magnitude by molecular design, self-assembly or multilayer printing and coating without having to resort to technologically complicated and expensive multilayer growth techniques based on epitaxy or sputtering as for inorganic semiconductors: We believe that the key mechanism to enhance the efficiency of spin current to charge current conversion in organic materials is a high anisotropy conductivity combined with the large spin accumulation caused by the long spin lifetime.

Methods:

Thickness dependence of voltage. The observed voltage V, which shows a single peak structure (see FIG. 2a), comprises multiple voltage signals due to spin-wave modes, including magnetostatic surface waves and backward-volume magnetostatic waves. These spin waves show different spin pumping efficiencies; the spin current density $j_s^{0k}$ generated by the k-mode spin waves depends on the wavevector k, making it difficult to extract the voltage signal induced by the uniform magnetization precession, or the uniform mode k=0, where k is the wavevector. However, the variation of $V^k_{ISHE}$ as a function of the thickness d is independent of k: $V^k_{ISHE}$ a $j_s^{0k}$ (1/d) tan h (d/l) tan h (d/2l), since a short-circuit current in the PEDOT:PSS layer is responsible for the voltage variation. Thus we can estimate the spin diffusion length l by simply measuring the height of the voltage $V_{ISHE}$ using $V_{ISHE}$ a (1/d) tan h (d/l) tan h (d/2l), without discussing the details of the spin wave contributions. Although it is difficult to prepare $Y_3Fe_5O_{12}$ films which exhibit exactly the same spin-wave spectra, we confirmed that $V_{ISHE}$ increases with decreasing d in different sample sets, which was found to be $$V_{ISHE}^{d=40\ nm}/V_{ISHE}^{d=80\ nm}=1.15\sim1.45$$

enabling the rough estimation of the spin diffusion length λ=22~31 nm. Since the variation of $V_{ISHE}$ with respect to d is not large, thick PEDOT:PSS films on $Y_3Fe_5O_{12}$ are necessary to further change the value of $V_{ISHE}$; for example to obtain an ISHE signal with a magnitude of $V_{ISHE}$(d=80 nm)/4, a thick film with d=320 nm is required when λ=30 nm. Although this precludes further systematic measurements, even from the above rough discussion, importantly, we can estimate the spin lifetime $\tau_{s=}5\sim11$ ms and the obtained long $t_s$ is consistent with previous reports.

Model Calculation $$\Gamma=(\tau_{ex}/\tau_s)(\lambda/a_{eff})$$

where $$\tau_{ax}=\hbar/(SJ_{sd})\ \text{and}\ a_{eff}=v_e/a_S^2,$$

is estimated using the following parameters: S=16 and $a_S$=1.24 nm for $Y_3Fe_5O_{12}$; λ=7 nm, $\tau_s$=0.3 ps, and $v_e^{-1}$=1.23×10$^{23}$ cm$^{-3}$ for Pt; λ=30 nm, $\tau_{s=}$10 ms, and $v_e^{-1}$=3×10$^{20}$ cm$^{-3}$ for PEDOT:PSS. $v_e^{-1}$ is the carrier concentration. For a Pt/$Y_3Fe_5O_{12}$ film, Γ~20 has been obtained from the measured value of $V_{ISHE}$ together with the spin-charge conversion efficiency, resulting in $J_{sd}$~10 meV. For the PEDOT:PSS/$Y_3Fe_5O_{12}$ film, we obtain $J_{sd}$ Γ=6×10$^{-8}$ meV. Thus, the assumption G~0 is valid for a wide range of $J_{sd}$: $J_{sd}$>10$^{-7}$ meV thanks to the long spin lifetime in the PEDOT:PSS film.

Electric voltage and spin Hall angle. At first sight it might appear that the large conductivity anisotropy in the PEDOT:PSS film would tend to reduce the generated voltage, because the low conductivity perpendicular to the film $\sigma_c^x$ acts to reduce the injected spin current js (x)=−($\sigma_c^x$/e) $\nabla\delta\mu$(x), while the larger conductivity $\sigma_c^y$ in the film of the plane acts to shunt $V_{ISHE}$. In fact, using the spin-charge conversion efficiency $j_c(x)/j_s(x)=\alpha_{ISHE}$ and the equivalent circuit model with spin diffusion, we obtain the magnitude of the ISHE voltage as $$V_{ISHE}=(\alpha_{ISHE}w/\sigma_c^y)<js(x)>=\alpha_{ISHE}(\sigma_c^x/\sigma_c^y)(w/d)(1/e)\tan h(d/2\lambda)\tan(d/\lambda)\delta\mu_0$$

where $<j_s (x)>$ is the injected spin current density averaged over the thickness of the film. However, because of the relation $$\alpha_{ISHE}=(\sigma_c^y/\sigma_c^x)\theta_{SHE}$$

$V_{ISHE}$ becomes equation (1), which is independent of the conductivity anisotropy; from the measured value of $V_{ISHE}$, we find that the spin Hall angle in the PEDOT:PSS film is very small $$\theta_{SHE}^{PEDOT:PSS}\sim10^{-7}$$

as expected, and a key factor for the large voltage is the large spin accumulation $dm_0$ due to the long spin lifetime. In contrast to the spin Hall angle, the spin-charge conversion efficiency is significantly enhanced to be $a_{ISHE}\sim4\times10^{-2}$ because of the conductivity anisotropy.

Having understood the basic mechanism for efficient spin-to-charge conversion in terms of the long spin lifetime resulting in a large spin accumulation in the organic material at the interface between the magnetic and organic material, as well as the high anisotropy of the conductivity which enhances the spin Hall angle over what would otherwise be a small effect due to the relatively weak spin-orbit interaction in these materials, one or more of the following strategies for maximizing the thermoelectric efficiency of such devices may be implemented:

Organic Materials

Organic materials according to the present invention can comprise conjugated polymers, small molecule organic semiconductors or hybrid system comprising an organic material and one or more inorganic components or an organic insulating component. The organic material may be doped or undoped. It is preferred that in the organic material the ratio between the conductivity in the direction perpendicular to the induced spin current to the conductivity in the direction along the spin current is as high as possible. In a spin-Seebeck device, for example, the direction of the spin current is along the direction of the applied thermal gradient. As shown above this can naturally be achieved in conducting or semiconducting polymers as the polymer backbones are preferentially aligned in the plane of the substrate and charge transport along the polymer backbone tends to be faster than along the direction of interchain packing or along the direction of insulating side chains. In conjugated polymers with alkyl side chains that adopt a lamellar architecture the conductivity anisotropy may be enhanced by designing polymers with longer side chains. Alternatively, tailored multilayer structures may be used in which high conductivity and low conductivity layers are alternately stacked parallel to the substrate. Such multilayers can easily be fabricated by successive solution coating steps using techniques such as, but not limited to orthogonal solvents or crosslinking techniques. Generally, there is a wide range of molecular design and self-assembly techniques to influence the conductivity anisotropy of an organic material or composite that will be known to someone skilled in the art and any such technique may be used to optimize the efficiency of such organic spin-Seebeck thermoelectric converters or other spin-to-charge converters.

Spin-Orbit Coupling Enhancement

It is desirable also to enhance the spin-orbit coupling strength in the organic material. This may be achieved by synthesizing organic molecules and polymers that comprise heavier elements than C, S, or O. Thiophene rings may be replaced with selenophene or tellurophene rings. Heavy metal atoms can be incorporated easily into many molecular structures such as porphyrins or phtalocyanines. Organic heteroatom chemistry is extremely versatile and many techniques can be used to vary the elemental composition and molecular structure in order to optimize the spin-to-charge conversion efficiency.

Hybrid Structures

The device need not be a purely organic device, i.e., comprising only conjugated organic molecules or polymers. Hybrid structures comprising organic materials as well as inorganic materials, such as oxide semiconductor or dielectric layers, such as, but not limited to, ZnO, $TiO_2$, $In_2O_3$, $SiO_2$ or inorganic nanoparticles, such as CdSe, CdTe, PbSe, PbS or oxide nanoparticles, are compatible with the large-area solution processing or evaporation techniques used for organic materials, produce clean hybrid interfaces with controllable electronic structure, and can deliver device performance superior to that of purely organic device structures. To increase the conductivity anisotropy of a spin-to-charge converter hybrid multilayers may, for example, be used in which successive layers of conducting or semiconducting polymers and low conductivity semiconducting or dielectric oxide layers are deposited successively onto a substrate. Similarly, in a hybrid blend of an organic material with an inorganic nanoparticle the spin-orbit interaction may be enhanced by including heavy elements in the nanoparticles.

Optimization Strategies

Other optimization strategies may also be employed. For example, in a spin-Seebeck thermoelectric converter it will generally be important also to minimize the thermal conductivity of the active material. Most organic materials tend to have relatively low thermal conductivity, but specific molecular designs and self-assembly schemes, for example adapted from the design of organic thermoelectric materials, may be used to further lower the thermal conductivity of the active material.

Spin-Seebeck Devices

For the thermoelectric conversion using the spin-Seebeck effect, a solution-processable, large-area coverable technology is advantageous. The output voltage of conventional thermoelectric converters based on conventional Seebeck effect can be limited by the material-dependent Seebeck coefficient, and also be scaled with the number of connecting pairs of thermoelectric couplings. Contrary to this, the expected output voltage(s) of our spin-Seebeck thermoelectric converter increases simply with increasing the active area, because the electric voltage induced by the thermally driven spin current increases as the lateral size of the film becomes larger. From this viewpoint, large-area coating techniques based on solution-processes, such as spin-coating, roll-to-roll printing and coating methods can be desirable for manufacturing both the spin current generator and converter. For the former dilute magnetic oxides like transition metal-doped ZnO and $LaSrMnO_3$ may, for example, be used as the solution-processed ferromagnetic layers (see, for example, Coey, J. M. D., Dilute magnetic oxides, *Current Opinion in Solid State & Materials Science* 10, 83 (2006)). In particular, ZnO films are easily fabricated by solution-processing with relatively low temperature around 300° C. and can exhibit high temperature ferromagnetism if doped to a few percent with transition metals, such as but not limited to Mn, Fe, and Co.

Spin Current Generation

The spin current which is injected into the spin-to-charge conversion layer may be generated by techniques other than spin pumping. Generally, there is a variety of techniques which can be utilized to generate the spin current, such as, but not limited to: the generation of a pure spin current via the injection of a spin-polarized charge current where the spin current diffuses in the opposite direction, optical techniques, quantum interference, adiabatic quantum pumping, heat flow through a magnetic/non-magnetic interface or spin Hall effect. Other techniques for generating spin current will be known to the skilled person. Any such technique may be used to optimize the injection of the spin current into the spin-to-charge conversion layer.

Example A—Sample Preparation

The experiments were performed on solution-processed PEDOT:PSS films. A commercially available ink of PEDOT:PSS in water (CleviosTMPH1000, Heraeus) was additionally doped with dimethyl sulfoxide (DMSO, Sigma-Aldrich) and diluted with the surfactant Dynol™ 607 to a composition of 94.5 wt % PEDOT:PSS, 5 wt % DMSO, 0.5 wt % Dynol™ 607. The solution was spin-coated in air with a spinning speed of 3,000 r.p.m. The resulting films were then annealed in a nitrogen atmosphere at 180° C. for 3 h. Au contact pads (25 nm) were thermally evaporated through a shadow mask.

Example B—Conductivity of PEDOT:PSS

Figure 5:
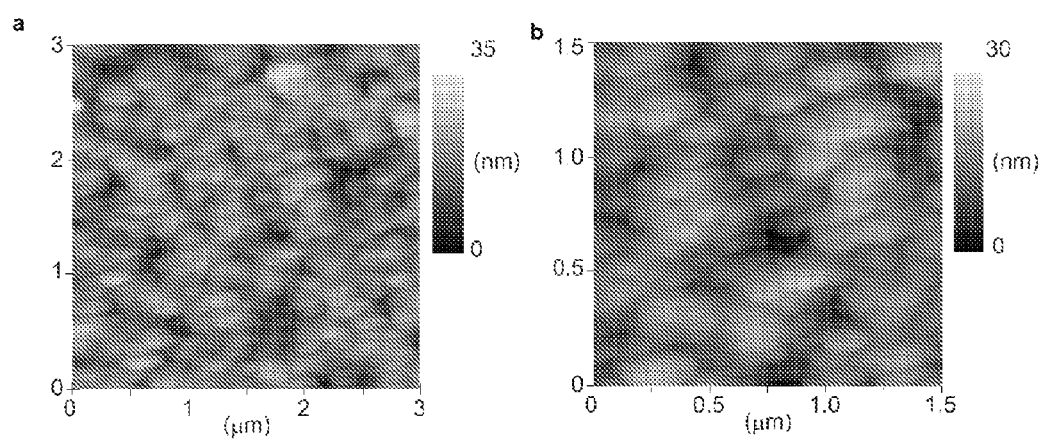
FIG. 5 shows a surface image of PEDOT:PSS.
Figure 6:
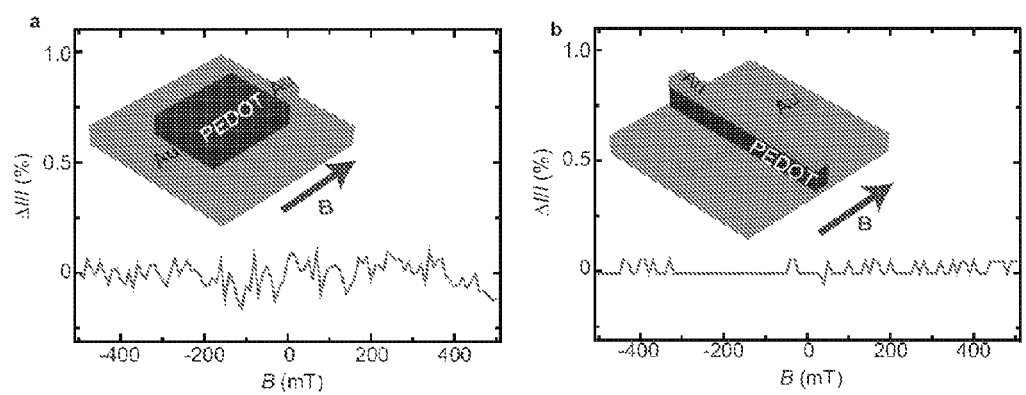
FIG. 6 shows the organic magnetoresistance (OMAR) in PEDOT:PSS.

FIG. 6 shows I-V characteristics for Au/PEDOT:PSS/Au devices for (FIG. 5*a*) lateral Hall-bar and (FIG. 5*c*) vertical cross-bar architectures. The corresponding photographs are shown in FIGS. 5*b* and 5*d*. In order to accurately estimate the conductivity, we employed four-point-probe measurements for both devices. For the lateral device, the cross-sectional area of the PEDOT:PSS film and the distance between the Au electrodes were 80 μm×65 nm and 80 μm, respectively. For the vertical device, these dimensions were 100 μm×100 μm and 100 nm, respectively.

For several π-conjugated conducting polymers, a conductivity anisotropy between the in-plane and out-of-plane direction has been measured, which is caused by a structural anisotropy of the organic thin films. Therefore, conductivities for both in-plane ($\sigma^y_c$) and out-of-plane ($\sigma^x_c$) directions were measured using devices with different electrode configurations, as shown in FIG. 6*b*, *d*. Our PEDOT:PSS films exhibited a large conductivity anisotropy with $\sigma^y_c$=660

Scm$^{-1}$ and σ$^x_c$=1.6×10$^{-3}$ Scm$^{-1}$, respectively, which were calculated from the linear I-V curves shown in FIG. 6a, c. These values were confirmed from PEDOT:PSS thickness-dependent transport measurements. The charge carrier concentration of PEDOT:PSS can be estimated to be 3×10$^{20}$ cm$^{-3}$ from previous results in the literature, which showed that approximately one charge carrier is doped per three ethylenedioxythiophen units, which was demonstrated using an electrochemical doping method. As a result, anisotropic mobilities for in-plane and out-of plane directions were evaluated to be 13.7 and 3.3×10$^{-5}$ cm$^2$ V$^{-1}$ s$^{-1}$, respectively, which could result from a morphological anisotropy of the PEDOT:PSS film. In order to calculate the spin relaxation time, we estimated the diffusion coefficient from the obtained mobility.

Example C—Surface Image of PEDOT:PSS

Thus FIG. 5a, b shows 3 μm×3 μm and 1.5 μm×1.5 μm Atomic Force Microscopy (AFM) images of the PEDOT:PSS films which were fabricated on a $Y_3Fe_5O_{12}$ film. The surface of the epitaxial $Y_3Fe_5O_{12}$ film was shown to be very smooth. The images obtained here display that PEDOT:PSS films on the $Y_3Fe_5O_{12}$ substrate were relatively smooth with a r.m.s. surface roughness of 3.1 nm, which was comparable to that of PEDOT:PSS spin-coated on a $SiO_2$/Si substrate. It can be seen that PEDOT:PSS formed elongated grains of about 50-80 nm in size. These typical grains were assigned to be PEDOT domains in a PSS matrix. The observed structure was shown to be the origin of the charge transport anisotropy between in-plane and out-of-plane directions, as described above.

Example D—Organic Magnetoresistance (OMAR) Effect in PEDOT:PSS

Figure 7:
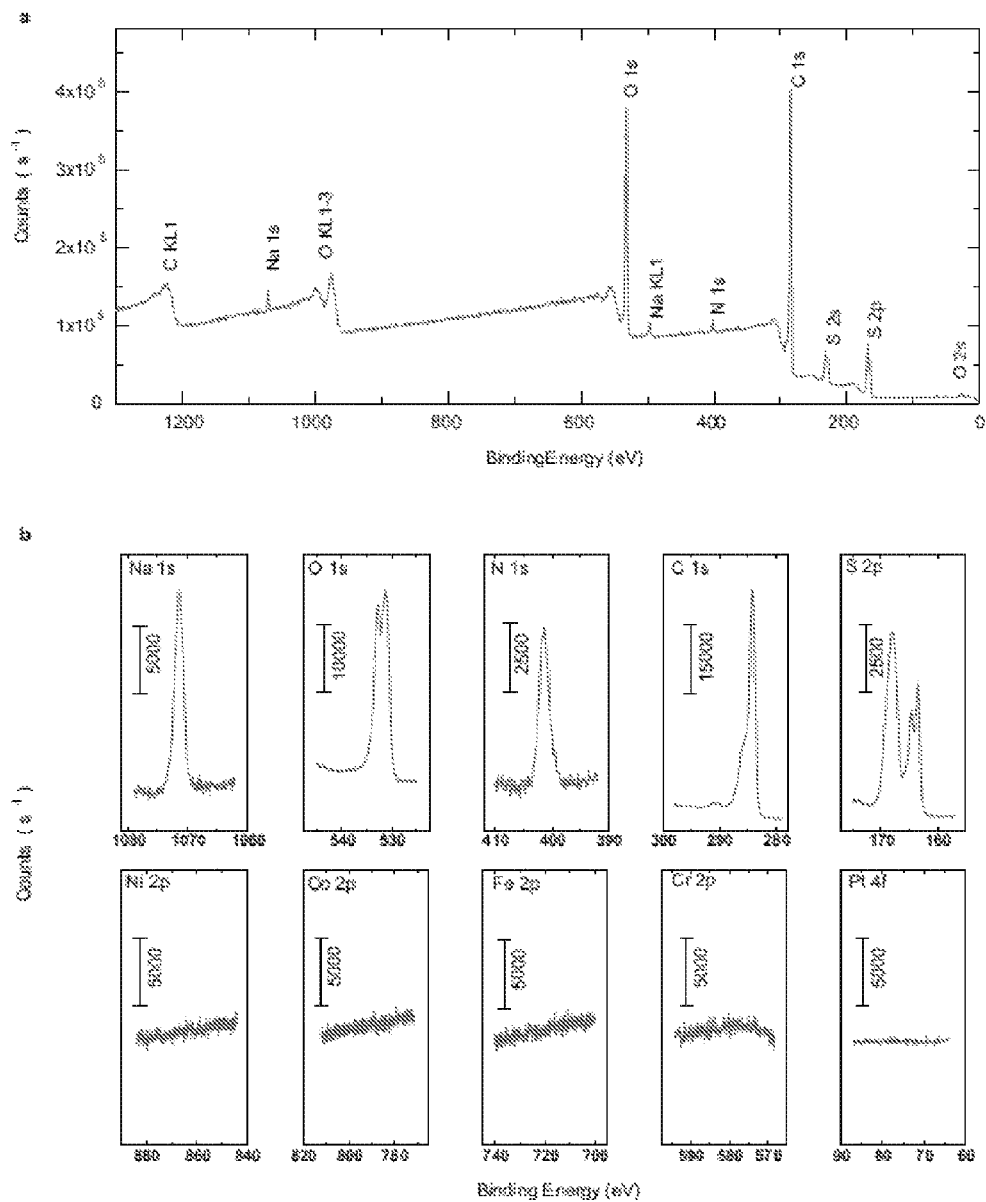
FIG. 7 shows XPS analysis of the elemental composition of PEDOT:PSS.

FIG. 7 shows the magnetoconductance ratio ΔI/I measured for Au/PEDOT:PSS/Au devices with (FIG. 7a) lateral and (FIG. 7b) vertical configurations at room temperature. Detailed device structures are shown in each inset.

It has been found for some organic materials that the conductance (resistance) can be modulated via the application of an external magnetic field, which has been called organic magnetoresistance (OMAR). The OMAR effect generally appears in organic light-emitting diodes and organic solar cells. Here, we show that there was no resistance change due to the OMAR effect for an external magnetic field around the FMR condition. FIG. 7a, b displays the magnetoconductance measured for Au/PEDOT:PSS/Au devices with lateral and vertical current flows (see insets). The magnetoconductance ΔI/I is defined as [I(B)–I(0)]/I(0), which was determined by measuring the current I at a constant applied voltage of 1.0 V as a function of the applied magnetic field B. It is to be noted that the OMAR effect is independent of the direction of the magnetic field vector. In our study, the field was applied in-plane in order to circumvent possible contributions of the Hall effect at room temperature. We did not observe an OMAR effect in any of the devices for magnetic fields of up to |B=500 mT|, regardless of the device configuration (lateral or vertical). The modulation of the conductance was estimated to be less than 0.1% (limited by the signal-to-noise ratio).

Example E—X-Ray Photoelectron Spectroscopy (XPS) Analysis of Elemental Composition of PEDOT:PSS In order to investigate a possible contamination of PEDOT:PSS by heavy metals and ferromagnetic metals, X-ray photoelectron spectroscopy (XPS) measurements were performed. Thus FIG. 16a shows an XPS survey scan of the PEDOT:PSS film, and FIG. 16b a high-resolution scan of individual elements; Na 1 s, N 1 s, C 1 s, O 1 s, and S 2p from left to right (top figures), Ni 2p, Co 2p, Fe 2p, Cr 2p, and Pt 4f from left to right (bottom figures). The sensitivity of detection was 50-100 p.p.m.

The survey scan indicates that only light-atoms present in the polymer backbone, i.e., carbon, oxygen, and sulfur are detected with high composition percentages (97 atomic %), as shown in FIG. 16a and Table 1. In conclusion, there are no heavy (or transition) metals inside the PEDOT:PSS film (FIG. 16b shows high-resolution scans for selected atoms). This is a clear indication that impurity scattering at heavy elements can be excluded from contributing to the observed voltage in the spin pumping measurements. Note that sodium is detected in the survey scan. Sodium is a known impurity in PEDOT:PSS, but it does not contribute to ISHE voltages. Sodium present in the film is due to the nature of the chemical synthesis processes of PEDOT:PSS, in which polymerization of the ethylenedioxythiophene monomer is carried out in an aqueous solution of sodium poly(styrene-4-sulfonate) (NaPSS).

TABLE 1

XPS analysis of the elemental composition of PEDOT:PSS

| Element | Peak binding energy (eV) | Composition (Atom %) |
| --- | --- | --- |
| C 1s | 284.64 | 63.52 |
| O 1s | 532.16 | 22.87 |
| S 2p | 168.19 | 10.57 |
| N 1s | 401.52 | 1.71 |
| Na 1s | 1071.69 | 1.32 |

Figure 8:
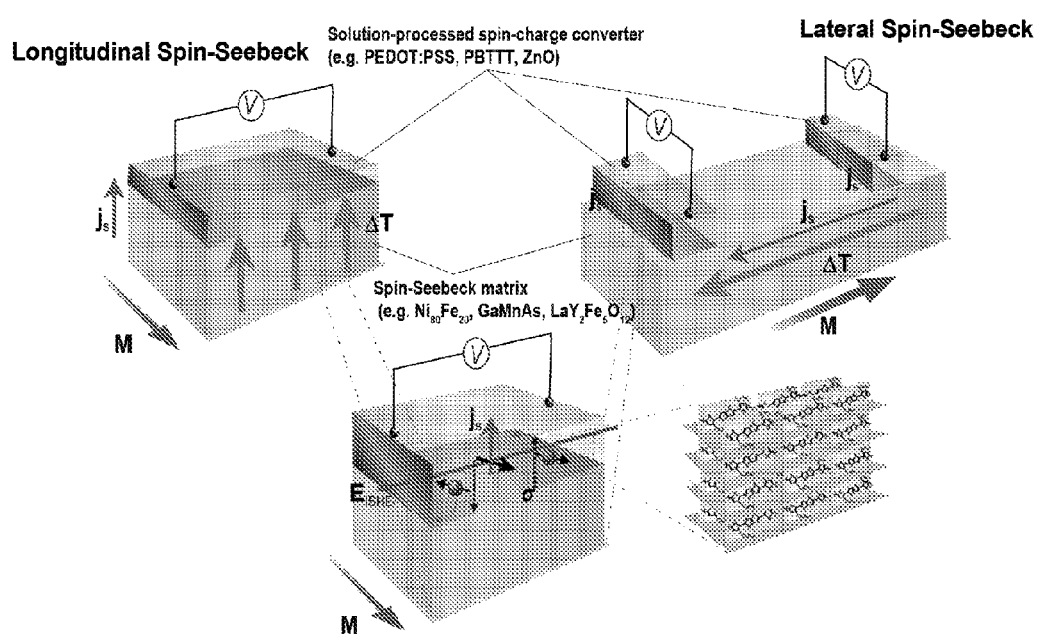
FIG. 8 shows details of Spin-Seebeck devices using a solution-processed spin-charge conversion layer.

Example F—Details of Spin-Seebeck Devices Using Solution-Processed Spin-Charge Converters The spin Seebeck devices enable to convert a temperature gradient into an electric voltage via thermally-driven pure current. FIG. 8 shows example spin-Seebeck device architectures; a longitudinal and a lateral structure, in which spin-charge conversion layers are made from the solution-processed organic materials are described. When a temperature gradient ΔT is applied simultaneously with an existence of a magnetization M, spin currents are induced into spin-charge conversion layer, resulting in a generation of an electric voltage V by ISHE.

For the longitudinal devices, spin-charge conversion layers are fabricated onto ferromagnetic, spin-Seebeck matrices like GaMnAs or YIG with magnetization M. In order to achieve large-area devices at low cost, a solution-processed method such like spin-coating is desirable.

When a temperature gradient ΔT is applied to vertical direction of spin-Seebeck matrix, the spin current is induced into the spin-charge conversion layer, which generates an electric voltage V through the ISHE (schematically illustrated in the bottom of FIG. 8). For the lateral devices, solution-processed spin-charge conversion layers are pre-fabricated and patterned to form two stripe shapes. A wet- and dry-etching method of polymers that has been recently developed can be directly utilized for the patterning processes (Chang, J.-F. et. al., Conjugated-polymer-based lateral heterostructures defined by high-resolution photolithography *Adv. Mater.* 20, 2825 (2010); Chang, J.-F. et. al., Hall-effect measurements probing the degree of charge-carrier delocalization in solution-processed crystalline molecular semiconductors. *Phys. Rev. Lett.* 107, 066601 (2011)). Alternatively, the organic material can be patterned by a range of other techniques including direct write printing. When the temperature gradient ΔT is applied in between two stripes, the induced spin current generates a voltage V as well. In the polymeric spin-charge conversion layer fabricated on the top of the spin Seebeck matrix, a lamellar structure due to self-aligned side-chains (shown in FIG. 8) is formed, results in high anisotropy of conductivity between longitudinal and lateral directions. As described above, this strongly enhances spin-charge conversion efficiency. For the longitudinal device structure it is possible to also induce a conductivity anisotropy, for example by uniaxially aligning the conjugated polymer with the polymer chains perpendicular to the temperature gradient. There is a wide range of such alignment techniques for conjugated polymers, including, but not limited to, the use of substrate alignment layers, mechanical stretching, shear forces applied during deposition or post-deposition processing, or annealing into thermotropic liquid-crystalline phases.

As previously described, in FIG. 8 the voltage is generated in-plane and thus the wider the electrodes the larger the voltage. Thus large-area deposition techniques using organic materials deposited from solution are particularly appropriate for these structures. In embodiments the temperature gradient and magnetic field are each perpendicular to the electric field generating the voltage. In FIG. 8 the spin current direction is indicated by js, and the spin polarization is defined by the direction of magnetic field; broadly speaking the thermal gradient injects the spin polarization. It is preferable for the temperature gradient to be perpendicular to the film, as this works best with a high conductivity in-plane and a low conductivity out-of-plane, as natural for organic conductors (contra where the temperature gradient is parallel to the film). In either case, $\vec{E}_{ISHE} \hat{\circ} \vec{j}_s \times \vec{\sigma}$.

Figure 9A:
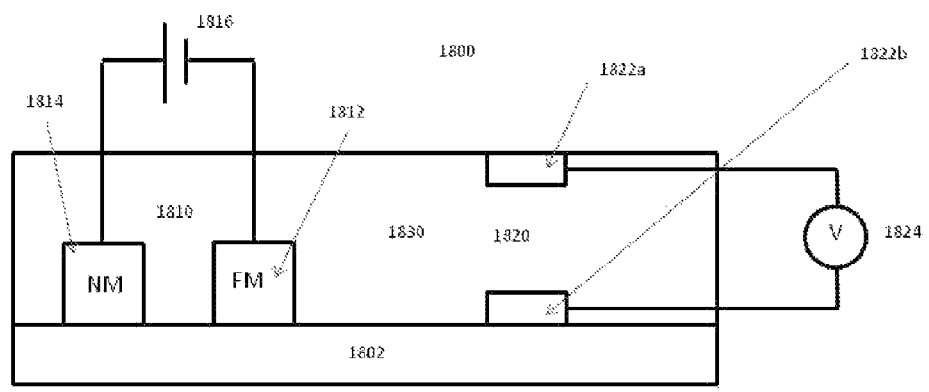
FIGS. 9a and 9b illustrate examples of non-local spin current generator in which a spin-current diffuses substantially isotropically away from ferromagnetic material, in combination with a spin-to-charge conversion device.
Figure 9B:
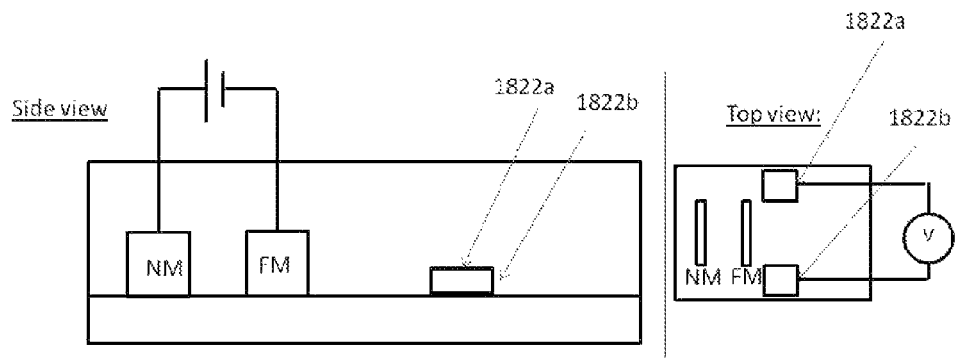

FIGS. 9a and 9b illustrates an example of a non-local spin current generator in which a spin-current diffuses substantially isotropically away from ferromagnetic material, in combination with a spin-to-charge conversion device, for, respectively, a case in which the easy axis of magnetisation of the ferromagnet is in-plane and a case in which the easy axis of magnetisation of the ferromagnet is out-of-plane. FIG. 9 shows examples of simple spintronic devices 1800 incorporating an organic spin-to charge converter as previously described. Thus a first, spin current generator region 1810 of the device comprises a magnetic, for example ferromagnetic, electrode 1812 and a non-magnetic electrode 1814, connected to a power source 1816, mounted in an insulating, for example glass, substrate 1802. This generates a spin current which diffuses through a layer of anisotropically conducting organic material 1830, diffusing isotropically away from ferromagnetic electrode 1812 and decaying with increasing distance from this electrode. The spin current reaches a second, spin-to-charge conversion region 1820 of the device, which comprises first and second electrodes 1822a,b in organic layer 1830, which generate a voltage 1824, as previously described.

In the "non-local architecture" arrangement of FIG. 9a, a pure spin current flows towards the spin-to-charge conversion region 1820 of the device from electrode 1812. In a case where the magnetisation of contact 1812 is in-plane, this pure spin current is converted into a charge current in the out-of-plane direction of the device. To detect the spin-charge current conversion the electrodes 1822a and 1822b are displaced with respect to contact 1812, or spaced apart, in an out-of-plane direction. In FIG. 9b, where the magnetisation of contact 1812 is out-of-plane, the electrodes 1822a and 1822b are displaced or spaced apart from one another laterally, i.e. in-plane, for example to either side of contact 1812.

Broadly speaking we have described, in embodiments, a spin-to-charge conversion device comprising an organic or partly organic spin-to-charge conversion layer and a spin-current generation layer in contact with said spin-to-charge conversion layer and inducing a spin current in said spin-to-charge conversion layer. The spin-to-charge conversion layer generates an electromotive force perpendicular to the induced spin-current and has a conductivity anisotropy between the conductivity perpendicular to the spin current and parallel to the spin current which is preferably larger than 10, more preferably larger than 100 and most preferably larger than 10000.

The almost-infinite chemical tunability of organic materials allows many variations in the types of device which can be fabricated. Potential applications of the efficient organic spin-to-charge converters described here include thermoelectric devices that use the spin Seebeck effect to convert a temperature gradient into an electric voltage. Other examples are (low-cost) memory devices. For example a magnetisation state such as a logic 0 or 1 may be indicated by a degree and/or direction of spin polarization in a region of a device, and this may be read out by a spin-to-charge conversion technique of the type we have described. Further, large area spintronic devices/circuits including memory devices and/or other spintronic devices may be fabricated, optionally on a flexible substrate. In this way applications may include intelligent labels that can be integrated into smart packaging for anti-counterfeiting, brand-protection or supply-chain management; and smart surfaces that have memory elements distributed over relatively large substrate areas.

The skilled person will appreciate that the techniques we have described are applicable to a wide range of organic conductors and semiconductors, preferably with a conductivity of at least $10^{-5}$ S/cm. Further, as previously mentioned, in principle a high electrical conductivity anisotropy should benefit spin-current to charge-current conversion in inorganic materials as well as organic materials. Thus the invention also contemplates a spin-to-charge conversion device/method comprising a spin-to-charge conversion part, wherein said spin-to-charge conversion part generates an electromotive force perpendicular to a spin-current flowing through the spin-to-charge conversion part and has an anisotropic electrical conductivity such that an electrical conductivity perpendicular to said spin current is greater than an electrical conductivity parallel to said spin current, preferably by a factor of at least 10, 100, 1000 or 10000.

No doubt many other effective alternatives to those described will occur to the skilled person. It will be understood that the invention is not limited to the described embodiments and encompasses modifications apparent to those skilled in the art lying within the spirit and scope of the claims appended hereto.

The invention claimed is:

1. A method of detecting an electrical signal from a spin-current, wherein said spin-current comprises a current having a spin predominantly aligned in a spin direction, the method comprising:
   flowing said spin-current through a layer of organic material in a vertical direction through said layer; and
   detecting a charge current or an electric field in a lateral direction in said layer of organic material, wherein said layer of organic material has an anisotropic electrical conductivity, having a higher conductivity in said lateral direction, which defines a high conductivity direction, than in said vertical direction, which defines a low conductivity direction;

injecting the spin-current in the low conductivity direction; and converting the injected spin-current into the charge current, wherein the charge current flows in the high conductivity direction, said converting comprising converting the spin-current into the charge current in the layer of organic material using the Inverse Spin Hall effect.

2. A method as claimed in claim 1 further comprising generating said spin-current by flowing an electrical current through a magnetic material adjacent said layer of organic material.

3. A method as claimed in claim 1 further comprising generating said spin-current by exciting magnetic resonance in a magnetic material adjacent said layer of organic material using an oscillating drive signal.

4. A method as recited in claim 1 wherein said layer of organic material includes a material to enhance spin-orbit coupling within said layer of organic material.

5. A method as claimed in claim 1 further comprising:

generating a voltage in said organic material using the Inverse Spin Hall Effect; and detecting the generated voltage.

6. A method as claimed in claim 1 wherein the layer of organic material comprises a conjugated polymer.

7. A method as recited in claim 1 wherein the layer of organic material has a lamellar structure comprising polymer backbones generally orientated within layers within the structure.

8. A method as recited in claim 7 wherein the polymer backbones lie preferentially in the lateral direction, the polymer having side chains lying preferentially in the vertical direction, and wherein said polymer backbones have a higher electrical conductivity than said side chains.

* * * * *